(12) United States Patent
Lee et al.

(10) Patent No.: US 11,595,062 B2
(45) Date of Patent: *Feb. 28, 2023

(54) DECOMPRESSION APPARATUS FOR DECOMPRESSING A COMPRESSED ARTIFICIAL INTELLIGENCE MODEL AND CONTROL METHOD THEREOF

(71) Applicant: Samsung Electronics Co., Ltd., Suwon-si (KR)

(72) Inventors: Dongsoo Lee, Suwon-si (KR); Sejung Kwon, Suwon-si (KR); Byeoungwook Kim, Suwon-si (KR); Parichay Kapoor, Suwon-si (KR); Baeseong Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 11 days.

This patent is subject to a terminal disclaimer.

(21) Appl. No.: 17/130,538

(22) Filed: Dec. 22, 2020

(65) Prior Publication Data

US 2021/0111741 A1 Apr. 15, 2021

Related U.S. Application Data

(63) Continuation of application No. 16/854,285, filed on Apr. 21, 2020, now Pat. No. 10,917,121.

(30) Foreign Application Priority Data

| May 24, 2019 | (KR) | ........................ | 10-2019-0060991 |
| Sep. 23, 2019 | (KR) | ........................ | 10-2019-0117081 |
| Nov. 6, 2019 | (KR) | ........................ | 10-2019-0140720 |

(51) Int. Cl.
*H03M 13/00* (2006.01)
*H03M 13/11* (2006.01)
(Continued)

(52) U.S. Cl.
CPC .......... *H03M 13/6312* (2013.01); *G06N 3/06* (2013.01); *H03M 13/1105* (2013.01); *H03M 13/118* (2013.01); *H03M 13/2778* (2013.01)

(58) Field of Classification Search
CPC ......... H03M 13/6312; H03M 13/1105; H03M 13/118; H03M 13/2778; G06N 3/06
See application file for complete search history.

(56) References Cited

U.S. PATENT DOCUMENTS

| 6,678,421 B1 * | 1/2004 | Daniell | .................. | H04N 19/61 |
| | | | | 382/248 |
| 10,462,476 B1 | 10/2019 | Chen et al. | | |

(Continued)

FOREIGN PATENT DOCUMENTS

| CN | 107832837 A | 3/2018 |
| KR | 10-2018-0052069 A | 5/2018 |
| KR | 10-2020-0090453 A | 7/2020 |

OTHER PUBLICATIONS

Tung et al., Deep Neural Network Compression by In-Parallel Pruning-Quantization, IEEE Transactions on Pattern Analysis and Machine Intelligence, Dec. 12, 2018.

(Continued)

*Primary Examiner* — Justin R Knapp
(74) *Attorney, Agent, or Firm* — Jefferson IP Law, LLP

(57) ABSTRACT

A decompression apparatus is provided. The decompression apparatus includes a memory configured to store compressed data decompressed and used in neural network processing of an artificial intelligence model, a decoder configured to include a plurality of logic circuits related to a compression method of the compressed data, decompress the compressed data through the plurality of logic circuits based on an input of the compressed data, and output the decompressed data, and a processor configured to obtain (Continued)

data of a neural network processible form from the data output from the decoder.

20 Claims, 25 Drawing Sheets

(51) Int. Cl.
*G06N 3/06* (2006.01)
*H03M 13/27* (2006.01)

(56) References Cited

U.S. PATENT DOCUMENTS

| | | |
|---|---|---|
| 2006/0109158 A1 | 5/2006 | Ettorre |
| 2009/0304291 A1 | 12/2009 | Boulton |
| 2018/0131946 A1 | 5/2018 | Lee et al. |
| 2020/0027247 A1 | 1/2020 | Minnen et al. |
| 2020/0099954 A1 | 3/2020 | Hemmer et al. |
| 2020/0186808 A1 | 6/2020 | Joshi et al. |
| 2020/0234131 A1 | 7/2020 | Lee et al. |
| 2021/0374503 A1* | 12/2021 | Kim .................. G06N 3/10 |

OTHER PUBLICATIONS

Han et al., Deep Compression: Compressing Deep Neural Networks With Pruning, Trained Quantization and Huffman Coding, ICLR 2016, Feb. 15, 2016.

Sian Jin et al., 'DeepSZ: A Novel Framework to Compress Deep Neural Networks by Using Error-Bounded Lossy Compression', arXiv:1901.09124v2, Apr. 23, 2019, Retrieved from https://arxiv.org/abs/1901.09124 [retrieved on Jul. 25, 2020], pp. 4-5, 7-8,10, and figure 1.

Dongsoo Lee et al., 'Network Pruning for Low-Rank Binary Indexing', arXiv:1905.05686v1, May 14, 2019, Retrieved from https://arxiv.org/abs/1905.05686 [retrieved on Jul. 25, 2020], pp. 1-2, 5, and figure 1,4.

Yu Cheng et al., 'A Survey of Model Compression and Acceleration for Deep Neural Networks', arXiv:1710.09282v7, Feb. 7, 2019, Retrieved from https://arxiv.org/pdf/1710.09282v7.pdf [retrieved on Jul. 27, 2020], p. 7, and figure 1.

International Search Report and Written Opinion dated Aug. 11, 2020, issued in International Patent Application No. PCT/KR2020/005269.

Ahn et al., "Double Viterbi: Weight Encoding for High Compression Ratio and Fast On-Chip Reconstruction for Deep Neural Network" (XP055651677), Nov. 27, 2018.

Bulat et al., "Matrix and tensor decompositions for training binary neural networks" (XP081170193); Apr. 16, 2019.

European Search Report dated Oct. 1, 2020, issued in European Application No. 20166954.6-1203.

Indian Office Action dated Apr. 5, 2022, issued in Indian Patent Application No. 202117027085.

* cited by examiner

FIG. 3A $$\begin{bmatrix} W_{11} & W_{12} & W_{13} & \cdots & W_{1n} \\ W_{21} & & & & W_{2n} \\ W_{31} & & \ddots & & W_{3n} \\ \vdots & & & & \vdots \\ W_{m1} & W_{m2} & W_{m3} & \cdots & W_{mn} \end{bmatrix}$$

FIG. 4

$$\begin{matrix} & A & & & & & & B \\ \begin{bmatrix} 1 & 0 & 1 & 0 & 0 \\ 1 & 0 & 0 & 1 & 0 \\ 1 & 0 & 0 & 0 & 1 \\ 1 & 1 & 0 & 0 & 0 \\ 0 & 1 & 1 & 0 & 0 \\ 0 & 1 & 0 & 1 & 0 \\ 0 & 1 & 0 & 0 & 1 \\ 0 & 0 & 1 & 1 & 0 \\ 0 & 0 & 0 & 1 & 1 \end{bmatrix} & \begin{bmatrix} x \\ x_0 \\ x_1 \\ x_2 \\ x_3 \\ x_4 \end{bmatrix} & = & \begin{bmatrix} - \\ 0 \\ 1 \\ - \\ 1 \\ 1 \\ - \\ 0 \\ 0 \end{bmatrix} \end{matrix}$$

410

$x = [\ 1\ 0\ 1\ 1\ 0\ ]$
Patch = [ 6 ]

1 0 1 1 0 / 0 1 / 0 1 1 0

FIG. 7A $$\begin{bmatrix} 1 & 0 & 1 & 0 & 0 \\ 1 & 0 & 0 & 1 & 0 \\ 1 & 0 & 0 & 0 & 1 \\ 1 & 1 & 0 & 0 & 0 \\ 0 & 1 & 1 & 0 & 0 \\ 0 & 1 & 0 & 1 & 0 \\ 0 & 1 & 0 & 0 & 1 \\ 0 & 0 & 1 & 1 & 0 \\ 0 & 0 & 0 & 1 & 1 \end{bmatrix}$$

FIG. 8A $$\begin{bmatrix} 1 & 1 & ⓪ & 1 & 1 & ⓪ & 1 & ⓪ & 1 \\ & & & & \ddots & & & & \end{bmatrix}$$

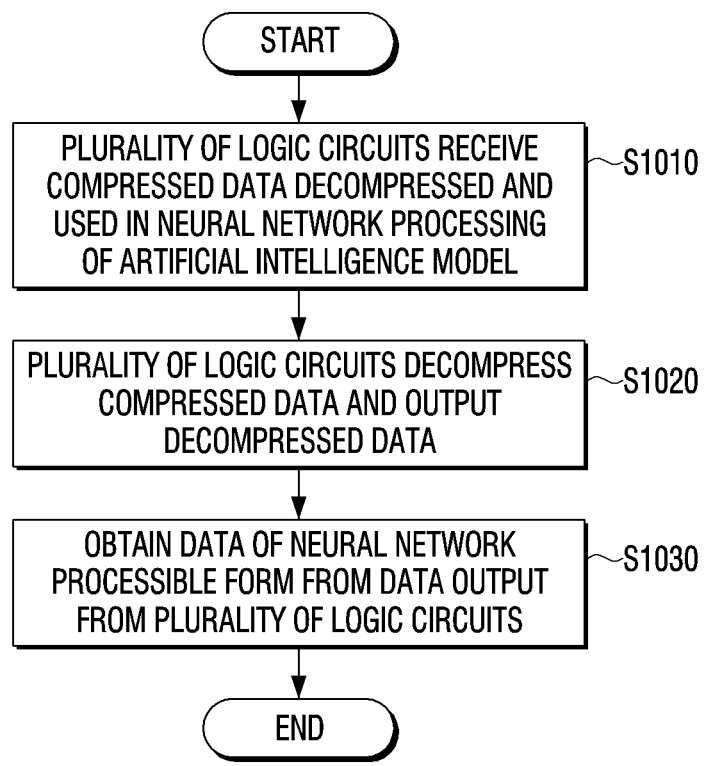

FIG. 11B $$\begin{bmatrix} W_{11} & W_{12} & W_{13} & \cdots & W_{1n} \\ W_{21} & & & & W_{2n} \\ W_{31} & & \ddots & & W_{3n} \\ \vdots & & & & \vdots \\ W_{m1} & W_{m2} & W_{m3} & \cdots & W_{mn} \end{bmatrix}$$

FIG. 11C $$\begin{bmatrix} Q_{11} & Q_{12} & Q_{13} & \cdots & Q_{1n} \\ Q_{21} & & & & Q_{2n} \\ Q_{31} & & \ddots & & Q_{3n} \\ \vdots & & & & \vdots \\ Q_{m1} & Q_{m2} & Q_{m3} & \cdots & Q_{mn} \end{bmatrix}\ \text{—1110}$$

$$\begin{bmatrix} \alpha_1 & \alpha_2 & \alpha_3 & \cdots & \alpha_m \end{bmatrix}\ \text{—1120}$$

FIG. 12

| w | m | OUTPUT |
|---|---|---|
| −1 | −1 | −1 |
| −1 | +1 | 0 |
| +1 | −1 | 0 |
| +1 | +1 | +1 |

DECOMPRESSION APPARATUS FOR DECOMPRESSING A COMPRESSED ARTIFICIAL INTELLIGENCE MODEL AND CONTROL METHOD THEREOF

CROSS-REFERENCE TO RELATED APPLICATION(S)

This application is a continuation application of prior application Ser. No. 16/854,285, filed on Apr. 21, 2020, and is based on and claims priority under 35 U.S.C. § 119(a) of a Korean patent application number 10-2019-0060991, filed on May 24, 2019, in the Korean Intellectual Property Office, of a Korean patent application number 10-2019-0117081, filed on Sep. 23, 2019, in the Korean Intellectual Property Office, and of a Korean patent application number 10-2019-0140720, filed on Nov. 6, 2019, in the Korean Intellectual Property Office, the disclosure of each of which is incorporated by reference herein in its entirety.

BACKGROUND

1. Field

The disclosure relates to a decompression apparatus for decompressing a compressed artificial intelligence model among an artificial Intelligence (AI) system that simulates functions of cognition and judgment of a human brain using a machine learning algorithm such as deep learning and an application thereof, and a control method thereof.

2. Description of Related Art

In recent years, pruning and quantization have been used to increase a compression rate while minimizing a performance degradation of a deep learning model. For example, a weight matrix whose weight, which is a certain value or less, is pruned to zero may be divided into a first data set representing a non-zero value, a second data accumulating the number of non-zero weights of each row, and a third data storing a column index corresponding to each non-zero value. Thereafter, the first to third data may be quantized. On the other hand, the weight matrix may represent a weight parameter of the deep learning model in a matrix form.

However, in order to restore an original weight matrix from the quantized data, a process of releasing the quantization and restoring the original weight matrix from the first to third data is required. That is, until restoring the original weight matrix, it is not possible to divide the quantized data into a plurality of groups and process each group in parallel.

Accordingly, a research is being actively conducted to maintain accuracy while increasing a compression rate in a compression process, and to secure an operation speed through parallel processing in a decompression process.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a decompression apparatus and method for a decompression apparatus.

Additional aspects will be set forth in part in the description which follows and, in part, will be apparent from the description, or may be learned by practice of the presented embodiments.

In accordance with an aspect of the disclosure, a decompression apparatus is provided. The decompression apparatus includes a memory configured to store compressed data decompressed and used in neural network processing of an artificial intelligence model, a decoder configured to include a plurality of logic circuits related to a compression method of the compressed data, decompress the compressed data through the plurality of logic circuits based on an input of the compressed data, and output the decompressed data, and a processor configured to obtain data of a neural network processible form from the data output from the decoder.

The memory is further configured to store a representative value matrix corresponding to the compressed data, wherein the processor is further configured to: obtain the data of the neural network processible form based on the decompressed data and the representative value matrix, and perform the neural network processing using the data of the neural network processible form, and wherein the decompressed data and the representative value matrix comprise matrices obtained by quantizing an original matrix included in the artificial intelligence model.

The memory is further configured to store a pruning index matrix corresponding to the compressed data, wherein the processor is further configured to update the decompressed data based on the pruning index matrix, wherein the pruning index matrix comprises a matrix obtained in a pruning process of the original matrix, and wherein the pruning index matrix is used in a process of obtaining the compressed data.

The memory is configured to further store a patch information corresponding to the compressed data, wherein the processor is further configured to change some binary data values of a plurality of elements included in the decompressed data based on the patch information, and wherein the patch information comprises error information generated in the process of obtaining the compressed data.

The memory is further configured to: store a first pruning index matrix corresponding to the compressed data, and store a second pruning index matrix corresponding to the compressed data, wherein the processor is further configured to: obtain a pruning index matrix based on the first pruning index matrix and the second pruning index matrix, and update the decompressed data based on the pruning index matrix, wherein the pruning index matrix comprises a matrix obtained in a pruning process of the original matrix, wherein the pruning index matrix is used in a process of obtaining the compressed data, and wherein the first pruning index matrix and the second pruning index matrix are obtained based on each of a first sub-matrix and a second sub-matrix obtained by factorizing the original matrix.

The decompressed data comprises a matrix obtained by interleaving the original matrix and then quantizing the interleaved matrix, and wherein the processor is further configured to: de-interleave the data of the neural network processible form according to a manner corresponding to the interleaving, and perform the neural network processing using the de-interleaved data.

The processor comprises a plurality of processing elements arranged in a matrix form, and wherein the processor is further configured to perform the neural network processing using the plurality of processing elements.

The decompressed data comprises a matrix obtained by dividing the original matrix into a plurality of matrices having a same number of columns and rows and quantizing one of the divided plurality of matrices.

The memory is further configured to store other compressed data decompressed and used in the neural network processing of the artificial intelligence model, wherein the decompression apparatus further comprises another decoder configured to: include a plurality of other logic circuits related to a compression method of the other compressed data, decompress the other compressed data through the plurality of other logic circuits based on an input of the other compressed data, and output the decompressed other data, and wherein the processor is further configured to: obtain other data of a neural network processible form from the decompressed other data output from the other decoder, and obtain a matrix in which each element includes a plurality of binary data by coupling the neural network processible data and the other data of the neural network processible form.

The decompression apparatus is implemented as one chip.

In accordance with another aspect of the disclosure, a control method of a decompression apparatus including a plurality of logic circuits related to a compression method of compressed data. The control method includes receiving, by the plurality of logic circuits, the compressed data decompressed and used in neural network processing of an artificial intelligence model, decompressing, by the plurality of logic circuits, the compressed data and outputting the decompressed data, and obtaining data of a neural network processible form from the data output from the plurality of logic circuits.

The control method may include obtaining the data of the neural network processible form based on the decompressed data and a representative value matrix corresponding to the compressed data; and performing the neural network processing using the data of the neural network processible form, wherein the decompressed data and the representative value matrix comprise matrices obtained by quantizing an original matrix included in the artificial intelligence model.

The control method may include updating the decompressed data based on a pruning index matrix corresponding to the compressed data, wherein the pruning index matrix comprises a matrix obtained in a pruning process of the original matrix, and wherein the pruning index matrix is used in a process of obtaining the compressed data.

The control method may include changing some binary data values of a plurality of elements included in the decompressed data based on patch information corresponding to the compressed data, wherein the patch information comprises error information generated in the process of obtaining the compressed data.

The control method may include obtaining a pruning index matrix based on a first pruning index matrix corresponding to the compressed data and a second pruning index matrix corresponding to the compressed data; and updating the decompressed data based on the pruning index matrix, wherein the pruning index matrix comprises a matrix obtained in a pruning process of the original matrix, wherein the pruning index matrix is used in the process of obtaining the compressed data, and wherein the first pruning index matrix and the second pruning index matrix are obtained based on each of a first sub-matrix and a second sub-matrix obtained by factorizing the original matrix.

The decompressed data comprises a matrix obtained by interleaving the original matrix and then quantizing the interleaved matrix, wherein the control method further comprises de-interleaving the data of the neural network processible form according to a manner corresponding to the interleaving, and wherein, in the performing of the neural network processing, the neural network processing is performed using the de-interleaved data.

In the performing of the neural network processing, the neural network processing is performed using a plurality of processing elements arranged in a matrix form.

The decompressed data comprises a matrix obtained by dividing the original matrix into a plurality of matrices having a same number of columns and rows and quantizing one of the divided plurality of matrices.

The decompression apparatus further comprises a plurality of other logic circuits related to a compression method of other compressed data, and wherein the control method further comprises: receiving the other compressed data decompressed and used in the neural network processing of the artificial intelligence model, decompressing, by the plurality of other logic circuits, the other compressed data, outputting the decompressed other data, obtaining other data of a neural network processible form output from the plurality of logic circuits, and obtaining a matrix in which each element includes a plurality of binary data by coupling the neural network processible data and the other data of the neural network processible form.

The decompression apparatus is implemented as one chip.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description taken in conjunction with the accompanying drawings, in which:

FIGS. 3A, 3B, 3C, and 3D are diagrams describing a method for obtaining a first matrix, a first pruning index matrix, and a second pruning index matrix according to various embodiments of the disclosure;

FIG. 4 is a diagram describing a method for obtaining a first matrix according to an embodiment of the disclosure;

FIGS. 7A, 7B, and 7C are diagrams describing a method for decompressing a first matrix according to various embodiments of the disclosure;

FIGS. 8A and 8B are diagrams describing an update operation of a second matrix according to various embodiments of the disclosure;

FIG. 10 is a flowchart describing a control method of a decompression apparatus according to an embodiment of the disclosure;

FIGS. 11A, 11B, 11C, and 11D are diagrams describing a learning process of an artificial intelligence model according to various embodiments of the disclosure;

FIG. 12 is a diagram describing a method for performing pruning in a learning process according to an embodiment of the disclosure;

The same reference numerals are used to represent the same elements throughout the drawings.

DETAILED DESCRIPTION

Figure 1:
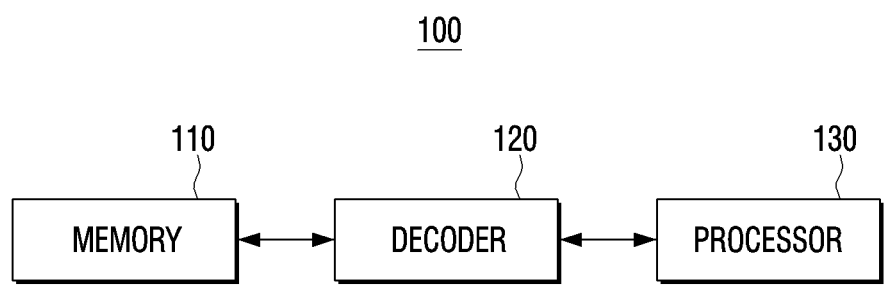
FIG. 1 is a block diagram illustrating a configuration of a decompression apparatus according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The disclosure provides a decompression apparatus that reduces memory usage in speech recognition or object recognition, uses an artificial intelligence model with reduced data capacity for high speed processing, and decompresses the artificial intelligence model with the reduced data capacity, and a control method thereof.

General terms that are currently widely used were selected as terms used in embodiments of the disclosure in consideration of functions in the disclosure, but may be changed depending on the intention of those skilled in the art or a judicial precedent, an emergence of a new technique, and the like. In addition, in a specific case, terms arbitrarily chosen by an applicant may exist. In this case, the meaning of such terms will be mentioned in detail in a corresponding description portion of the disclosure. Therefore, the terms used in the disclosure should be defined on the basis of the meaning of the terms and the contents throughout the disclosure rather than simple names of the terms.

In the disclosure, an expression "have," "may have," "include," "may include," or the like, indicates an existence of a corresponding feature (for example, a numerical value, a function, an operation, a component such as a part, or the like), and does not exclude an existence of an additional feature.

The expression "at least one of A and/or B" should be understood to represent either "A" or "B" or any one of "A and B."

Expressions "first," "second," or the like, used in the disclosure may indicate various components regardless of a sequence and/or importance of the components, will be used only in order to distinguish one component from the other components, and do not limit the corresponding components.

Singular expressions include plural expressions unless the context clearly indicates otherwise. It should be further understood that terms "include" or "constitute" used in the application specify the presence of features, numerals, operations, components, parts, or combinations thereof mentioned in the specification, but do not preclude the presence or addition of one or more other features, numerals, operations, components, parts, or combinations thereof.

In the specification, a term "user" may be a person who uses an electronic apparatus or an apparatus (e.g., an artificial intelligence electronic apparatus) that uses the electronic apparatus.

Hereinafter, an embodiment of the disclosure will be described in more detail with reference to the accompanying drawings.

FIG. 1 is a block diagram illustrating a configuration of a decompression apparatus according to an embodiment of the disclosure.

Referring to FIG. 1, a decompression apparatus 100 may be an apparatus that decompresses a compressed artificial intelligence model. Here, the compressed artificial intelligence model is data available for neural network processing after decompression, and may be data that is unavailable for neural network processing before decompression.

For example, the decompression apparatus 100 may be an apparatus that decompresses compressed data included in the compressed artificial intelligence model, finally obtains neural network processible data (hereinafter, referred to as restored data), and performs neural network processing using the restored data. For example, the decompression apparatus 100 may be implemented in the form of separate hardware (HW) existing between a memory and a chip in a server, a desktop personal computer (PC), a notebook, a smartphone, a tablet PC, a television (TV), a wearable device, or the like, and may also be implemented as a system on chip (SOC). Alternatively, the decompression apparatus 100 may be implemented in the form of a chip such as a central processing unit (CPU), a graphics processing unit (GPU), a digital signal processing (DSP), a network processing unit (NPU), or the like, may be implemented in the form of a circuit, and may be implemented in the form of a configuration inside the chip.

However, the type of the decompression apparatus 100 as described above is merely an example, and any apparatus may be used as long as it is an apparatus that decompresses compressed data included in the compressed artificial intelligence model, finally obtains restored data, and performs neural network processing using the restored data.

The decompression apparatus 100 includes a memory 110, a decoder 120, and a processor 130, as illustrated in FIG. 1.

The memory 110 may store compressed data that is decompressed and used in neural network processing of the artificial intelligence model. For example, the memory 110 may store the compressed data received from a compression apparatus. The compressed data and the data constituting the artificial intelligence model before compression may be expressed in at least one matrix form. Hereinafter, for convenience of explanation, the compressed data will be described as a first matrix, and data from which the first matrix is decompressed will be described as a second matrix.

The second matrix may be converted into restored data together with a representative value matrix to be described later.

Here, the first matrix may be a matrix in which the second matrix is compressed based on a compression method. For example, the first matrix may be a matrix compressed through an encoding matrix formed based on a logic circuit such as an XOR gate in which the second matrix constitutes the decoder 120. The second matrix may be a matrix in which an original matrix (weight matrix) included in the artificial intelligence model is compressed through pruning or the like, or a matrix in which the original matrix is quantized. Alternatively, the second matrix may be a matrix including binary data obtained in the quantization process of the pruned original matrix. The original matrix, which is a matrix included in the artificial intelligence model, is a matrix obtained after a learning process of the artificial intelligence model is completed, and may be in a state in which compression is not performed. On the other hand, the encoding matrix is a matrix used for compressing the second matrix, and may be a matrix used to implement the logic circuits constituting the decoder 120.

A detailed method of obtaining the first matrix by compressing the second matrix will be described later with reference to the accompanying drawings.

The decoder 120 may include a plurality of logic circuits related to a method of compressing the compressed data. As an example of performing compression using the encoding matrix, the decoder 120 may include the plurality of logic circuits formed based on the encoding matrix. The logic circuit may be an XOR gate, but is not limited thereto. For example, the decoder 120 may include a plurality of XOR gates to which respective input/output terminals are connected based on the encoding matrix. That is, if binary data is input to the plurality of XOR gates, the respective input/output terminals may be connected to output a matrix multiplication result of the encoding matrix and the binary data. The binary data refers to data that is binary quantized and displayed in 1 bit, but is not limited thereto, and may be obtained through other quantization methods.

In a case in which the compression method is designed, the decoder 120 may be first implemented by randomly connecting the plurality of XOR gates, and the encoding matrix may be obtained by comparing an input of each of the plurality of XOR gates and an output of each of the plurality of XOR gates. In addition, the encoding matrix including 0 and 1 may be first generated and the second matrix may be compressed based on the encoding matrix to obtain the first matrix. In this case, when the decompression apparatus 100 is implemented, the decoder 120 may also be implemented by connecting the input/output terminals of the plurality of XOR gates so as to correspond to the encoding matrix.

When the first matrix is input, the decoder 120 may decompress the first matrix through the plurality of logic circuits and output the decompressed data. For example, when binary data of units of a first number included in the first matrix is input, the decoder 120 may output binary data of units of a second number larger than the first number through the plurality of XOR gates. For example, the decoder 120 may sequentially receive binary data of five units included in the first matrix, and may sequentially output binary data of nine units through the plurality of XOR gates. For example, if the encoding matrix is in the form of 9×5, the decoder 120 may include five input terminals and nine output terminals. In addition, if the first matrix has 25 elements (parameters), the decoder 120 may receive binary data of five units five times and output binary data of nine units five times, thereby outputting a total of 45 elements.

The processor 130 may obtain the second matrix from the binary data output from the decoder 120. In the above example, the processor 130 may obtain the second matrix including 45 elements from the binary data of nine units which are output five times.

On the other hand, the memory 110 may further store a representative value matrix corresponding to the first matrix. For example, the memory 110 may store a representative value matrix corresponding to the first matrix received from the compression apparatus. The representative value matrix may be obtained in the quantization process of the pruned original matrix, and may be a set of representative values representing a plurality of elements included in the pruned original matrix.

The processor 130 may obtain a restored matrix based on the second matrix and the representative value matrix, and perform the neural network processing using the restored matrix. Here, the second matrix and the representative value matrix may be matrices obtained by quantizing the original matrix included in the artificial intelligence model. Quantization means changing data into one of a plurality of sample values, and in the quantization, because the data is represented by the plurality of sample values, an overall data capacity may be reduced, but an error may occur by a difference between the changed sample value and the original data.

For example, the compression apparatus may quantize the original matrix included in the artificial intelligence model to obtain the representative value matrix and a second matrix including binary quantization data. Here, the binary quantization data refers to data represented by 1 bit. As a more specific example, the compression apparatus may perform quantization by a method of setting one representative value for a predetermined number of elements included in the original matrix, and representing each element as the binary quantization data. In this way the compression apparatus may obtain the representative value matrix including the representative values for the entire original matrix, and may obtain the second matrix obtained by converting the elements included in the original matrix into the binary quantized data. However, the compression method is not limited thereto, and the compression apparatus may use any other quantization method.

The processor 130 may obtain a restored matrix to be used for neural network processing from the second matrix and the representative value matrix. Here, the restored matrix may be different from the original matrix. That is, due to quantization error, the restored matrix may be different from the original matrix. However, the restored matrix may be obtained so that a result of neural network processing using the original matrix and a result of neural network processing using the restored matrix are not significantly different in a compression process to be described later, and this will be described later.

The processor 130 may include a plurality of processing elements arranged in a matrix form, and may perform neural network processing of the artificial intelligence model using the plurality of processing elements.

On the other hand, the memory 110 may further store a pruning index matrix corresponding to the first matrix. For example, the memory 110 may also store the pruning index matrix corresponding to the first matrix received from the compression apparatus.

The pruning index matrix is a matrix obtained in the pruning process of the original matrix, and may be used in a process of compressing the second matrix into the first matrix.

First, pruning is a method of removing redundant weights, specifically changing the number of certain elements (specific deep learning parameters) to zero in the original matrix included in the artificial intelligence model. For example, the compression apparatus may prune an original matrix of m×n by changing elements of a predetermined value or less among a plurality of elements included in the original matrix of m×n to 0, and may obtain a pruning index matrix of m×n representing 0 or 1 indicating whether each of the plurality of elements included in the original matrix of m×n is pruned.

In addition, the compression apparatus may use the pruning index matrix in the process of compressing the second matrix into the first matrix based on the encoding matrix. Specifically, the compression apparatus may determine a value of the binary data of units of the first number to be included in the first matrix so that a matrix multiplication result of the binary data of units of the first number to be included in the first matrix and the encoding matrix is equal to the corresponding binary data of units of the second number included in the second matrix, and in this case, because the first number is smaller than the second number, the value of the binary data of units of the first number to be included in the first matrix satisfying the above may not be derived. In this case, the compression apparatus may determine the value of the binary data of units of the first number to be included in the first matrix by determining some of the corresponding binary data of units of the second number included in the second matrix as unnecessary data based on the pruning index matrix. A detailed description thereof will be described later.

The processor 130 may update the second matrix based on the pruning index matrix. For example, the processor 130 may change some of the plurality of elements included in the second matrix to 0 based on the pruning index matrix.

However, the processor 130 is not limited thereto, and the memory 110 may not store the pruning index matrix. That is, if the compression apparatus does not provide the pruning index matrix to the decompression apparatus 100, the decompression apparatus 100 may identify that the pruning index matrix is not used in the process of compressing the second matrix into the first matrix, and may omit an operation of changing some of the plurality of elements included in the second matrix to 0.

Alternatively, although the compression apparatus may provide the pruning index matrix to the decompression apparatus 100, the pruning index matrix may not be used in the process of compressing the second matrix into the first matrix. In this case, the compression apparatus may provide information indicating that the pruning index matrix is not used in the process of compressing the second matrix into the first matrix to the decompression apparatus 100, and the decompression apparatus 100 may omit the operation of changing some of the plurality of elements included in the second matrix to 0.

On the other hand, the memory 110 may further store patch information corresponding to the first matrix. For example, the memory 110 may also store the patch information corresponding to the first matrix received from the compression apparatus.

Here, the patch information may include error information generated in the process of compressing the second matrix into the first matrix. Specifically, the compression apparatus may determine the value of the binary data of units of the first number to be included in the first matrix by using the pruning index matrix in the process of compressing the second matrix into the first matrix. However, even when the pruning index matrix is used, the value of the binary data of units of the first number to be included in the first matrix may not be determined. In this case, the compression apparatus may determine the value of the binary data of units of the first number to be included in the first matrix to minimize the number of errors. For example, the compression apparatus may determine the value of the binary data of units of the first number to be included in the first matrix to minimize the number of bits in which the difference between the matrix multiplication result of the binary data of units of the first number to be included in the first matrix and the encoding matrix and the corresponding binary data of units of the second number included in the second matrix occurs. In addition, the compression apparatus may generate, as the patch information, information about the number of bits, a position, and the like in which the difference occurs. In addition, the compression apparatus may provide the patch information to the decompression apparatus 100 to solve an error that may occur in the decompression process.

The processor 130 may change binary data values of some of the plurality of elements included in the second matrix based on the patch information. For example, the processor 130 may change a value of the element indicated by the patch information among the plurality of elements included in the second matrix to 1 if the value of the element is 0 and to 0 if the value of the element is 1.

On the other hand, the memory 110 may further store a first pruning index matrix corresponding to the compressed data and a second pruning index matrix corresponding to the first matrix. For example, the memory 110 may store the first pruning index matrix and the second pruning index matrix corresponding to the first matrix received from the compression apparatus. In this case, the compression apparatus may provide the first pruning index matrix and the second pruning index matrix instead of the pruning index matrix to the decompression apparatus 100.

First, as described above, the pruning index matrix may be a matrix obtained in the pruning process of the original matrix.

The first pruning index matrix and the second pruning index matrix may be obtained based on each of a first sub-matrix and a second sub-matrix obtained by factorizing the original matrix. Factorization is a kind of factorization, which means dividing a matrix into two smaller matrices, and for example, a method such as non-negative matrix factorization (NMF) may be used. However, the method of obtaining the first pruning index matrix and the second pruning index matrix is not limited thereto, and various methods may be used.

The compression apparatus may obtain the first pruning index matrix and the second pruning index matrix by factorizing the original matrix to obtain the first sub-matrix and the second sub-matrix and pruning the first sub-matrix and the second sub-matrix, respectively. Thereafter, the compression apparatus may update the first pruning index matrix and the second pruning index matrix by comparing a result of the neural network processing using the pruning index matrix with a result of the neural network processing using the first pruning index matrix and the second pruning index matrix. The updating method may be a method of changing a pruning rate of each of the first sub-matrix and the second sub-matrix. Finally, the compression apparatus may obtain the first pruning index matrix and the second pruning index matrix, in which a difference between the operation results of the two cases falls within a threshold value.

The compression apparatus may reduce a data capacity by converting the pruning index matrix into the first pruning index matrix and the second pruning index matrix. For example, the compression apparatus may convert a pruning index matrix of 100×50 into a first pruning index matrix of 100×10 and a second pruning index matrix of 10×50. In this case, the compression apparatus may reduce data of 5000 to data of 1000+500=1500.

The processor 130 may obtain the pruning index matrix based on the first pruning index matrix and the second pruning index matrix, and update the second matrix based on the pruning index matrix. Specifically, each of the first pruning index matrix and the second pruning index matrix may include binary data, and the processor 130 may obtain the pruning index matrix by performing matrix multiplication operation on the first pruning index matrix and the second pruning index matrix.

The processor 130 may change some of the plurality of elements included in the second matrix to 0 based on the pruning index matrix.

On the other hand, the second matrix may be a matrix obtained by interleaving the original matrix and then quantizing the interleaved matrix. Interleaving means rearranging the order of data included in a matrix by a predetermined unit. That is, the compression apparatus may also perform interleaving before quantizing the original matrix.

The processor 130 may de-interleave the restored matrix according to a method corresponding to interleaving, and perform the neural network processing using the de-interleaved restored matrix.

As interleaving and de-interleaving operations are added, the compression rate may be improved during the quantization process. For example, if the elements of the original matrix are not evenly distributed, the compression rate or accuracy may be significantly degraded as the pruning index matrix is 1 or 0 consecutive. In this case, when interleaving a matrix to be compressed, randomness of the pruning index matrix may be improved, thereby improving the compression rate and the accuracy. There is no particular limitation on the type of the interleaving method and the de-interleaving method, and various methods may be used according to a decompression speed and randomness. For example, a method used in turbo code may be used, and there is no particular limitation as long as the interleaving method and the de-interleaving method correspond to each other.

On the other hand, the second matrix may be a matrix obtained by dividing the original matrix into a plurality of matrices having the same number of columns and the same number of rows, and quantizing one of the plurality of divided matrices.

An advantage of dividing the original matrix into the plurality of matrices may be, for example, where one of m or n is significantly larger than the other in the original matrix of m×n. For example, in the case of compressing an original matrix of 100×25 into a matrix of 100×r and a matrix of r×25, r is generally selected to be smaller than 25 and the compression ratio may be lowered. In this case, when the original matrix of 100×25 is divided into four matrixes of 25×25, and each of the four matrices is compressed, the compression ratio may be improved. In addition, when the original matrix is divided into the plurality of matrices, the amount of computation may also be reduced during the compression process. That is, it may be efficient to perform compression after dividing a skewed matrix into square matrices.

On the other hand, the memory 110 may further store a third matrix that is decompressed and used in the neural network processing of the artificial intelligence model. For example, the memory 110 may further store the third matrix received from the compression apparatus.

The decompression apparatus 100 includes a plurality of other logic circuits related to a compression method of the third matrix based on the encoding matrix, and may further include the other decoder that decompresses the other compressed data through the plurality of other logic circuits and outputs the other decompressed data, when the third matrix is input. Here, the third matrix may be a matrix in which a fourth matrix is compressed based on the encoding matrix. The plurality of other logic circuits may be a plurality of other XOR gates.

However, the plurality of other XOR gates is not limited thereto, and the plurality of other XOR gates may be connected to each input/output terminal based on the other encoding matrix different from the encoding matrix. In this case, the number of binary data input to the plurality of other XOR gates and the number of output binary data may not be the first number and the second number, respectively. Here, the third matrix may be a matrix in which the fourth matrix is compressed based on the other encoding matrix.

The processor 130 may obtain a fourth matrix of neural network operable form from data output from the other decoder, and may combine the second matrix and the fourth matrix to obtain a matrix in which each element includes a plurality of binary data.

That is, the decompression apparatus 100 may also include a plurality of decoders. This is because each element included in the original matrix may include the plurality of binary data. For example, the compression apparatus may divide the original matrix into a plurality of matrices in which each element is one, and perform quantization and compression on each of the plurality of matrices. For example, if each element of the original matrix includes two binary data, the compression apparatus may divide the original matrix into two matrices in which each element includes one binary data, and quantize and compress each of the two matrices to obtain the first matrix and the third matrix described above. In addition, the compression apparatus may provide the first matrix and the third matrix to the decompression apparatus 100. The decompression apparatus 100 may process the first matrix and the third matrix in parallel using the decoder 120 and the other decoder, respectively, and the processor 130 may merge the second matrix and the fourth matrix to obtain a matrix in which each element includes a plurality of binary data.

Meanwhile, hereinabove, the decoder 120 has been described as being disposed between the memory 110 and the processor 130. In this case, because an internal memory provided in the processor 130 stores the decompressed data, a memory having a large capacity is required, and power consumption may be considerable. However, decompression may be performed while computation is performed in a processing element unit inside the processor 130, and influence on a processing execution time of the processing element unit may be made smaller without incurring overhead on existing hardware. In addition, because the decoder 120 may be disposed between the memory 110 and the processor 130, it is possible to design in the form of a memory wrapper without modifying the contents of an existing accelerator design. Such a configuration may be more suitable for a convolutional neural network (CNN) that repeatedly uses the entire decompressed data.

However, the decompression apparatus 100 is not limited thereto, and may also be implemented as one chip. In this case, the memory 110 may receive only some compressed data from an external memory outside the chip and store only some compressed data. In addition, because the memory 110 performs decompression on-the-fly whenever the processing element unit requests data, the memory 110 may use a memory having a small capacity and may also reduce power consumption. However, because the memory 110 stores only some compressed data, decompression and de-interleaving may be performed whenever the processing element unit requests the data, thereby increasing latency and increasing power consumption in the long term. In addition, the decoder 120 is added to the inside of the existing accelerator, it may be necessary to modify a lot of the existing design. Such a configuration may be more suitable for a recurrent neural network (RNN) that uses some compressed data once.

The decompression apparatus 100 may perform decompression through the method described above to obtain a restored matrix, and perform neural network processing using the obtained restored matrix.

Figure 2:
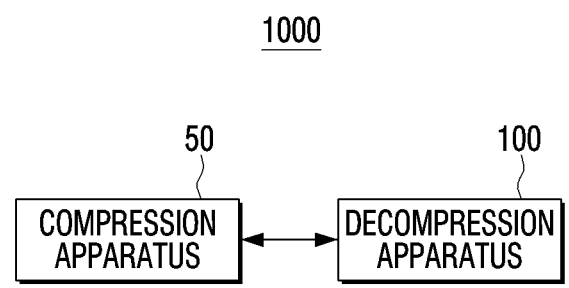
FIG. 2 is a diagram describing an electronic system according to an embodiment of the disclosure.

FIG. 2 is a diagram describing an electronic system according to an embodiment of the disclosure.

Referring to FIG. 2, an electronic system 1000 includes a compression apparatus 50 and the decompression apparatus 100.

First, the compression apparatus 50 may be an apparatus that compresses an artificial intelligence model. For example, the compression apparatus 50 is an apparatus that compresses at least one original matrix included in the artificial intelligence model, and may be an apparatus such as a server, a desktop PC, a notebook, a smartphone, a tablet PC, a TV, a wearable device, or the like.

However, this is merely an example, and any apparatus may be used as long as the compression apparatus 50 may be an apparatus that may reduce a data size of the artificial intelligence model by compressing the artificial intelligence model. Here, the original matrix may be a weight matrix.

The compression apparatus 50 may quantize the original matrix included in the artificial intelligence model to obtain the representative value matrix and the second matrix. As described above, the quantization method is not particularly limited.

The compression apparatus 50 may compress the second matrix into the first matrix based on the encoding matrix. Alternatively, the compression apparatus 50 may compress the second matrix into the first matrix based on the encoding matrix and whether the plurality of elements included in the original matrix are pruned. In particular, the compression rate of the second matrix may be improved as the compression apparatus 50 further considers whether the pruning is performed.

The compression apparatus 50 may obtain only the first matrix from the second matrix. Alternatively, the compression apparatus 50 may also obtain the first matrix and the patch information from the second matrix. In particular, the compression rate of the second matrix may be improved as the compression apparatus 50 further users the patch information. However, as the size of the patch information increases, the compression rate may decrease.

Meanwhile, the compression apparatus 50 may obtain the pruning index matrix indicating whether each element included in the original matrix is pruned by pruning the original matrix included in the artificial intelligence model. The compression apparatus 50 may provide the pruning index matrix to the decompression apparatus 100.

Alternatively, the compression apparatus 50 may obtain the pruning index matrix indicating whether each element included in the original matrix is pruned by pruning the original matrix included in the artificial intelligence model, and may compress the pruning index matrix into the first pruning index matrix and the second pruning index matrix using the above-described method. The compression apparatus 50 may provide the first pruning index matrix and the second pruning index matrix to the decompression apparatus 100.

The decompression apparatus 100 may receive the compressed artificial intelligence model from the compression apparatus 50, perform decompression, and perform the neural network processing.

However, the electronic system 1000 is not limited thereto and may be implemented as one electronic apparatus. For example, when the electronic apparatus compresses the artificial intelligence model and performs the neural network processing in the same manner as the compression apparatus 50, the electronic apparatus may perform decompression in the same manner as the decompression apparatus 100.

Hereinafter, for convenience of explanation, the compression apparatus 50 and the decompression apparatus 100 will be described as being divided. In addition, a compression operation of the compression apparatus 50 will be described first, and an operation of the decompression apparatus 100 will be described in more detail with reference to the accompanying drawings.

FIGS. 3A to 3D are diagrams describing a method for obtaining a first matrix, a first pruning index matrix, and a second pruning index matrix according to various embodiments of the disclosure.

Referring to FIGS. 3A to 3D, FIG. 3A is a diagram illustrating an example of an original matrix included in an artificial intelligence model, and the original matrix may be in the form of m×n. For example, the original matrix may be in the form of 10000×8000. In addition, each of the plurality of elements in the original matrix may be 32 bits. That is, the original matrix may include 10000×8000 elements having 32 bits. However, the original matrix is not limited thereto, and the size and the number of bits of each element of the original matrix may vary.

Figure 3B:
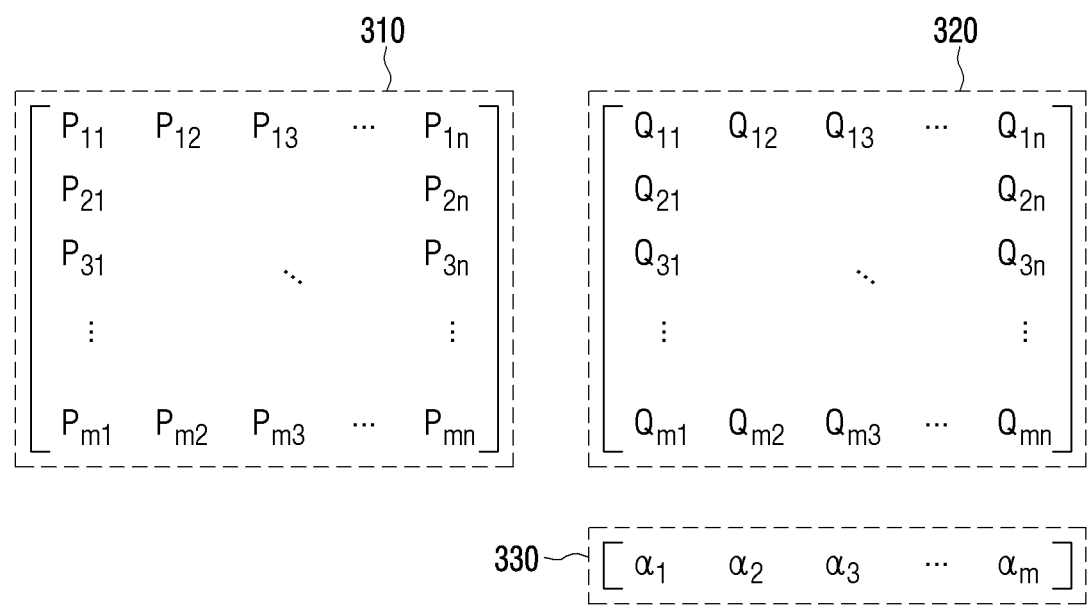

FIG. 3B is a diagram illustrating a result of pruning and quantizing the original matrix illustrated in FIG. 3A.

The compression apparatus 50 may prune each of the plurality of elements included in the original matrix based on the first threshold value, and obtain a pruning index matrix 310 indicating whether each of the plurality of elements is pruned as binary data.

For example, the compression apparatus 50 may prune the original matrix by converting elements smaller than 30 among the plurality of elements included in the original matrix into 0 and maintaining the remaining elements as it is. In addition, the compression apparatus 50 may obtain the pruning index matrix 310 by converting the element converted to 0 among the plurality of elements into 0 and the remaining elements into 1. That is, the pruning index matrix 310 has the same size as the original matrix and may include 0 or 1.

In addition, the compression apparatus 50 may quantize non-pruned elements among the plurality of elements included in the original matrix to obtain a representative value matrix 330 and a second matrix 320 including the binary quantized data.

The compression apparatus 50 may quantize n elements in the original matrix of FIG. 3A using one representative value. Accordingly, FIG. 3B illustrates the representative value matrix 330 including m elements. Here, the number n of elements quantized to one representative value is only one example, and other values may be used, and if other values are used, the number of elements included in the representative value matrix 330 may also vary. In addition, the compression apparatus 50 may obtain the second matrix 320 including the binary quantized data, and the second matrix 320 has the same size as the original matrix and may include 0 or 1.

Figure 3C:
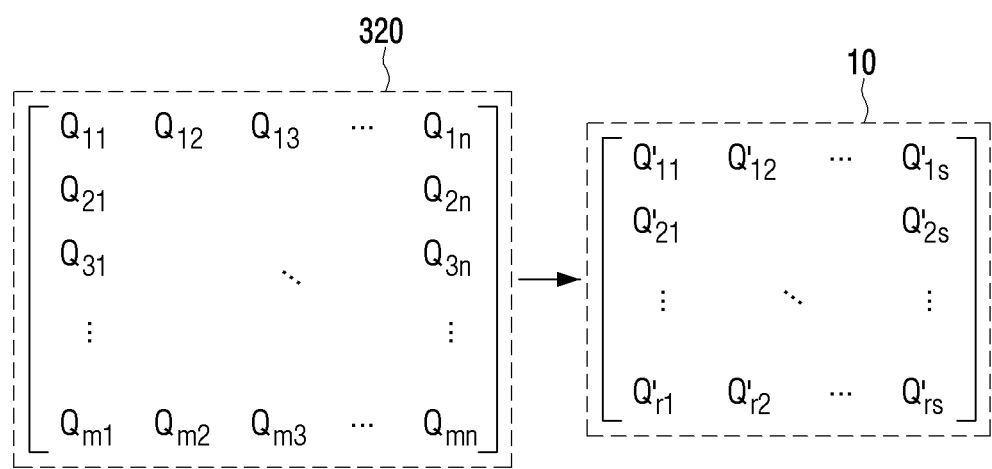

The compression apparatus 50 may compress the second matrix 320 into a first matrix 10 based on the encoding matrix, as illustrated in FIG. 3C. The number of elements included in the first matrix 10 is smaller than the number of elements included in the second matrix 320. A method of obtaining the first matrix 10 will be described later with reference to FIG. 4.

Figure 3D:
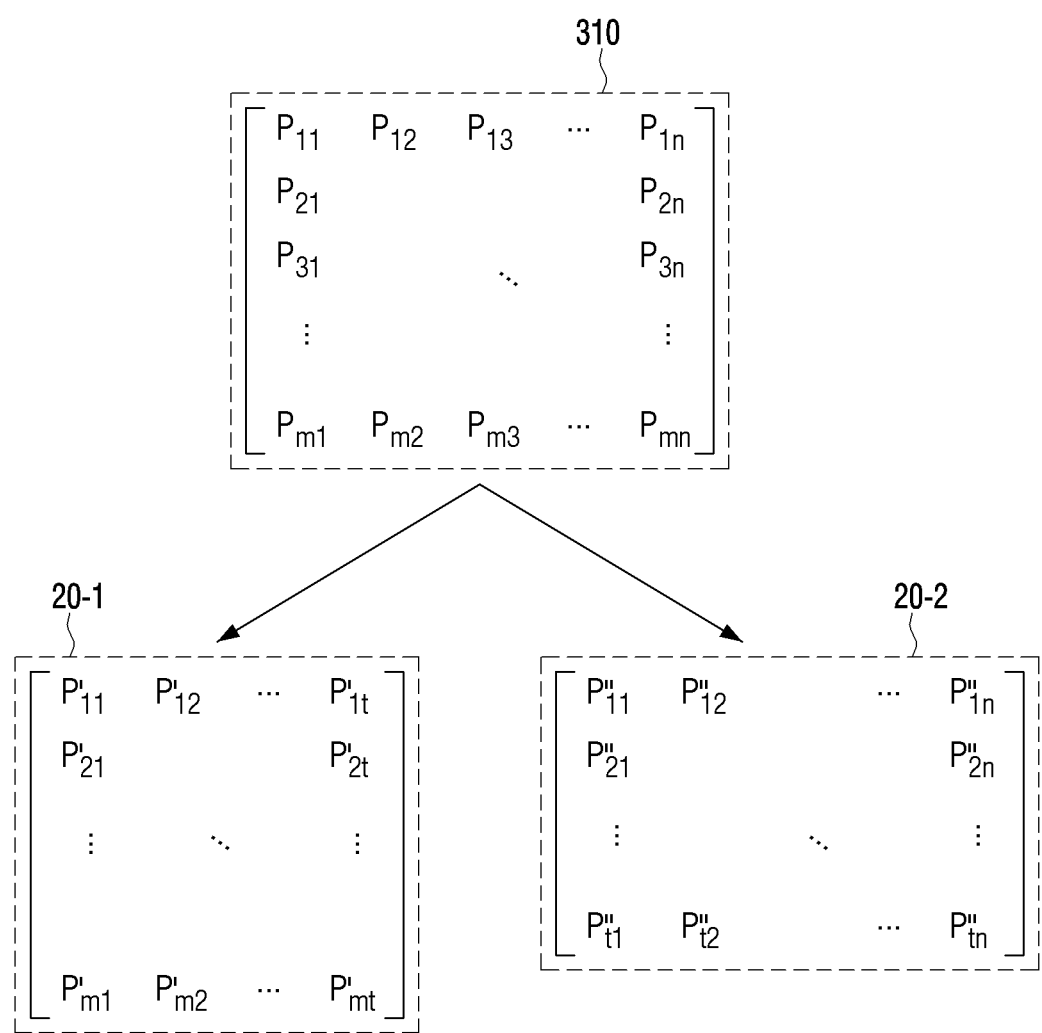

The compression apparatus 50 may compress the pruning index matrix 310 into a first pruning index matrix 20-1 and a second pruning index matrix 20-2, as illustrated in FIG. 3D. Specifically, the compression apparatus 50 may obtain the first pruning index matrix 20-1 and the second pruning index matrix 20-2 by factorizing the original matrix into the first sub-matrix and the second sub-matrix, and pruning the first sub-matrix and the second sub-matrix, respectively. In addition, the compression apparatus 50 may update the first pruning index matrix 20-1 and the second pruning index matrix 20-2 so that a neural network processing result using a matrix multiplication result of the first pruning index matrix 20-1 and the second pruning index matrix 20-2 is close to a neural network processing result using the pruning index matrix 310. For example, if an accuracy of the neural network processing result using the matrix multiplication result of the first pruning index matrix 20-1 and the second pruning index matrix 20-2 becomes low, the accuracy may be improved by lowering a pruning rate used when pruning each of the first sub-matrix and the second sub-matrix. In this case, pruning rates for obtaining the first pruning index matrix 20-1 and the second pruning index matrix 20-2 may be different from each other. The compression apparatus 50 may improve the accuracy of the neural network processing result using the matrix multiplication result of the first pruning index matrix 20-1 and the second pruning index matrix 20-2 by repeating such a process.

In FIGS. 3A to 3D, the compression apparatus 50 is described as performing both pruning and quantization, but is not limited thereto. For example, the compression apparatus 50 may perform the quantization without performing the pruning.

FIG. 4 is a diagram describing a method for obtaining a first matrix according to an embodiment of the disclosure.

Referring to FIG. 4, FIG. 4 illustrates a method of compressing a predetermined number of elements B included in the second matrix into x using an encoding matrix A. Here, x may be included in the first matrix. For example, nine binary data included in the second matrix may be compressed into five binary data. At this time, the pruned data among the nine binary data is represented as "–," and does not need to be restored after compression. That is, nine equations may be generated according to a matrix multiplication of FIG. 4, but equations including "–" need not be considered. Accordingly, the nine binary data included in the second matrix may be compressed into the five binary data.

That is, a matrix multiplication result of the binary data x of units of a first number included in the first matrix and the encoding matrix A may be the same as the corresponding binary data B of units of a second number included in the second matrix. Here, the second number is larger than the first number. In the compression process, the binary data of units of the second number included in the second matrix is converted into the binary data of units of the first number smaller than the second number, and the converted binary data may form the first matrix. In the matrix multiplication process, the multiplication processing between the respective binary data may be performed in the same way as an AND gate, addition processing between multiplication results may be performed in the same way as an XOR gate, and the AND gate has a higher priority of calculation than the XOR gate.

Here, the encoding matrix may include a first type element and a second type element, and the number of first type elements included in the encoding matrix and the number of second type elements included in the encoding matrix may be the same as each other. For example, the encoding matrix may include zeros and ones, and the number of zeros and the number of ones may be the same as each other. However, the encoding matrix is not limited thereto, and when the number of elements included in the encoding matrix is odd, a difference between the number of zeros and the number of ones may be within a predetermined number (e.g., one).

On the other hand, as illustrated in FIG. 4, when the number of pruned data is three (– is three), the five binary data may not satisfy the remaining six equations. Therefore, the compression apparatus 50 may obtain, as the patch information, information on the number of equations not established by the five binary data and position information of last equation 410. In FIG. 4, 10110 represents compressed five binary data, 01 represents the information on the number of equations not established, and 0110 may be the position information of the last equation 410. Here, the position information of the last equation 410 has been described as indicating that it is the sixth based on the unpruned data, but is not limited thereto. For example, the positional information of the last equation 410 may be obtained to indicate that it is the ninth based on nine data regardless of pruning.

On the other hand, in the matrix multiplication process, the multiplication processing between the respective binary data may be performed in the same way as an AND gate, addition processing between multiplication results may be performed in the same way as an XOR gate, and the AND gate has a higher priority of calculation than the XOR gate.

For convenience of explanation, the matrix multiplication will be described using 10110, which is a value of x derived from FIG. 4. The matrix multiplication of a first row of A with 10110, which is the value of x, is omitted because it is unnecessary data according to pruning. In a matrix multiplication of 10010, which is a second row of A, with 10110, which is the value of x, first, for each digit, a multiplication operation between binary data is performed in the same manner as the AND gate. That is, 1, 0, 0, 1, 0 are obtained through operations of 1×1=1, 0×0=0, 0×1=0, 1×1=1, and 0×0=0. Thereafter, an addition operation is performed on 1, 0, 0, 1, 0 in the same manner as the XOR gate, and 0 is finally obtained. Specifically, 1 may be obtained by the addition operation of the first and second binary data 1 and 0, 1 may be obtained by the addition operation of an operation result 1 and third binary data 0, 0 may be obtained by the addition operation of an accumulation operation 1 and fourth binary data 1, and 0 may be finally obtained by the addition operation of an accumulation operation result 0 and fifth binary data 0. Here, the operation order may be changed as much as possible, and even if the operation order is changed, the finally obtained value is the same. In this way, the matrix multiplication between the remaining rows of A and 10010 may be performed.

However, as described above, there may be an equation (e.g., the last row (i.e., the last equation 410) of A) that is not established, and the operation result thereof is as follows. In a matrix multiplication of 00011, which is the last row of A, with 10110, which is the value of x, first, for each digit, a multiplication operation between binary data is performed in the same manner as the AND gate. That is, 0, 0, 0, 1, 0 are obtained through operations of 0×1=0, 0×0=0, 0×1=0, 1×1=1, and 0×0=0. Thereafter, an addition operation is performed on 0, 0, 0, 1, 0 in the same manner as the XOR gate, and 1 is finally obtained. Specifically, 0 may be obtained by the addition operation of the first and second binary data 0 and 0, 0 may be obtained by the addition operation of an operation result 0 and third binary data 0, 1 may be obtained by the addition operation of an accumulation operation result 0 and fourth binary data 1, and 1 may be finally obtained by the addition operation of an accumulation operation result 1 and fifth binary data 0. This does not match 0, which is the value of the last row of the first B, and the compression apparatus 50 provides it to the decompression apparatus 100 as the patch information, and the decompression apparatus 100 may compensate for this based on the patch information. That is, the decompression apparatus 100 may obtain position information of the row where the equation does not establish, based on the patch information, and may convert binary data of a row corresponding to the position information among the matrix multiplication results of the encoding matrix A and x into other binary data. In the example of FIG. 4, the decompression apparatus 100 may convert the value of the last row of the matrix multiplication results of the encoding matrix A and x from 1 to 0 based on the patch information.

As such, the compression apparatus 50 may obtain the first matrix, the first pruning index matrix, the second pruning index matrix, and the patch information from the original matrix.

However, the compression apparatus 50 is not limited thereto, and may compress the second matrix into the first matrix by a method not using the patch information. For example, according to the example of FIG. 4, the compression apparatus 50 may determine x as 6 bits to prevent generation of the patch information.

Alternatively, the compression apparatus 50 may also compress the second matrix into the first matrix without performing the pruning. For example, in the example of FIG. 4, the compression apparatus 50 may determine the number of bits of x based on dependency between the nine equations. That is, if there is no dependency between the nine equations, the compression apparatus 50 obtains x including nine bits, and in this case, the compression may not be performed. Alternatively, if there is a dependency between the nine equations, the compression apparatus 50 obtains x including the number of bits smaller than nine, and in this case, the compression may be performed.

Figure 5A:
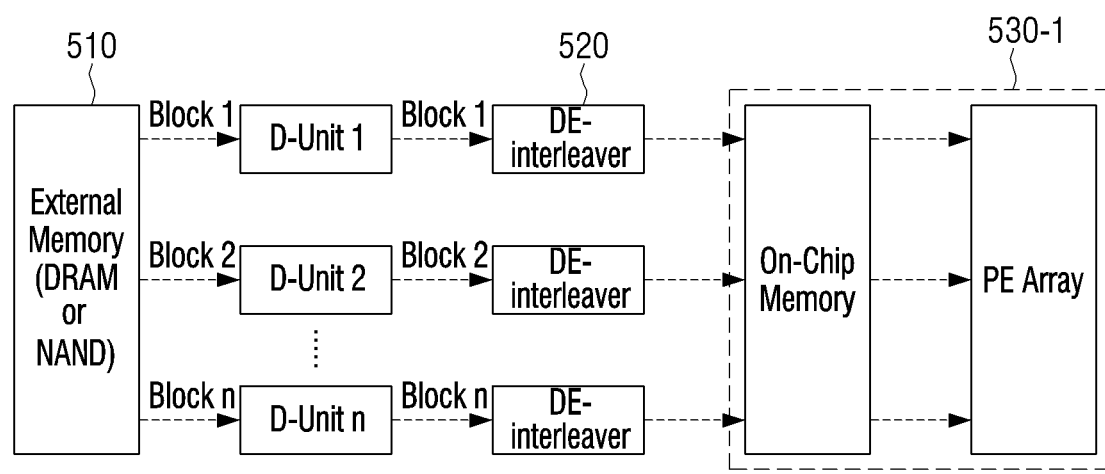
FIGS. 5A and 5B are diagrams describing a decompression apparatus according to various embodiments of the disclosure.
Figure 5B:
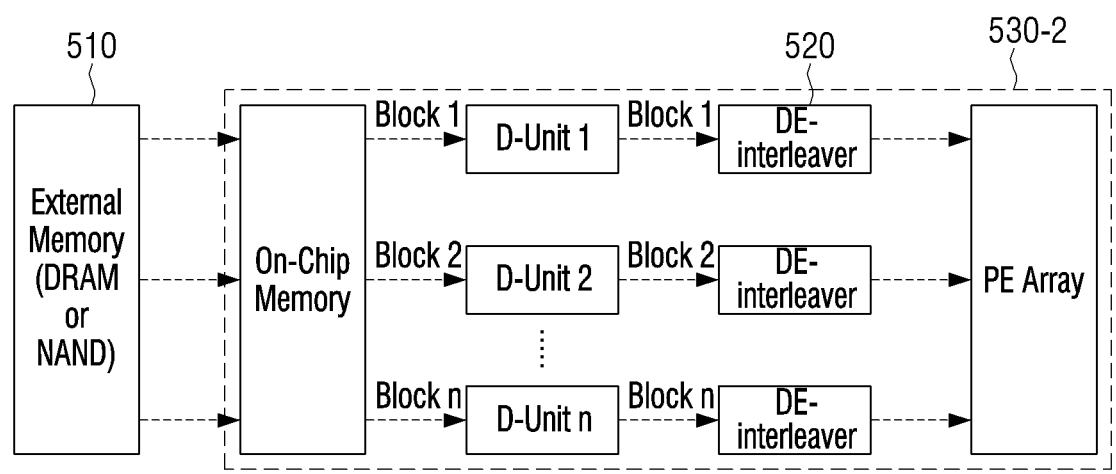

FIGS. 5A and 5B are diagrams describing a decompression apparatus according to various embodiments of the disclosure.

Figure 6:
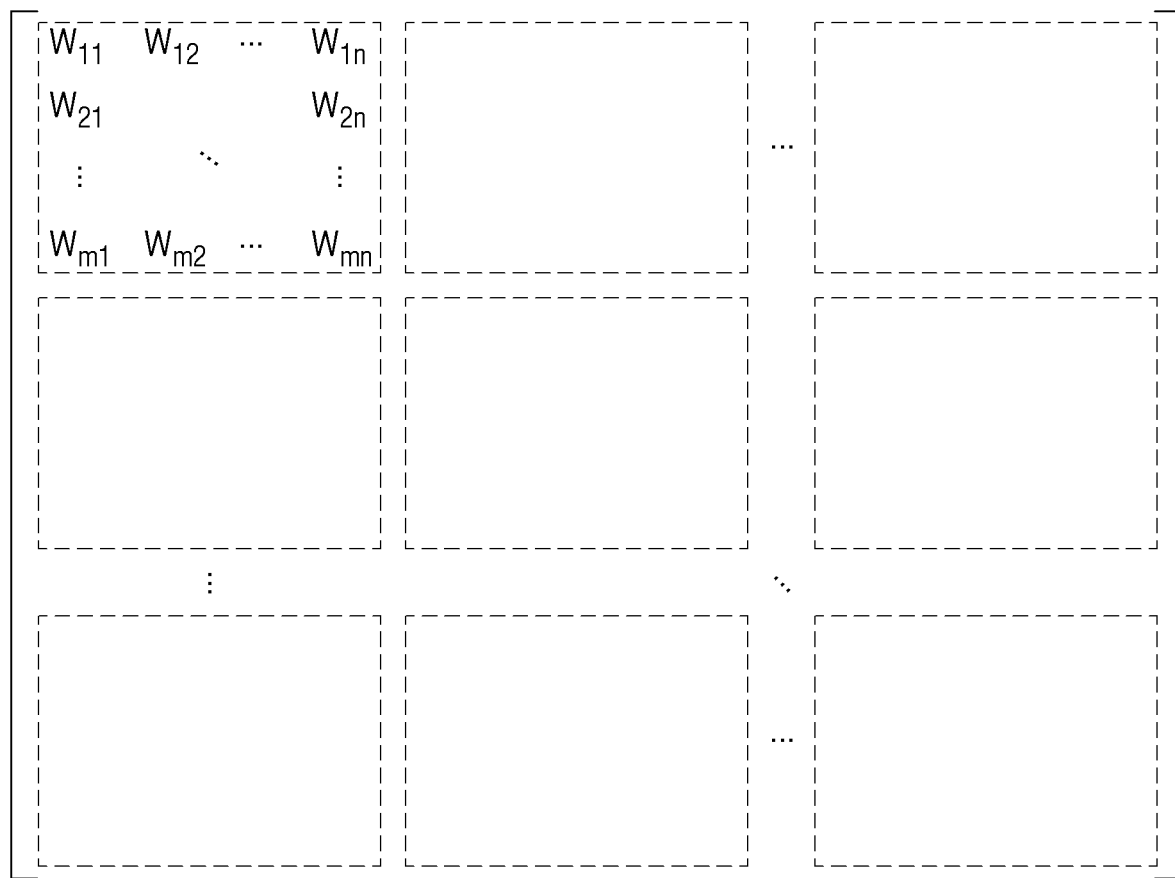
FIG. 6 is a diagram describing an original matrix according to an embodiment of the disclosure.

FIG. 6 is a diagram describing an original matrix according to an embodiment of the disclosure.

First, referring to FIG. 5A, the decompression apparatus 100 may include a plurality of decoders (D-Units). The decompression apparatus 100 may further include an external memory 510, a plurality of de-interleavers 520, and a processor 530-1. Here, the external memory 510 and the processor 530-1 may be the same as the memory 110 and the processor 130 of FIG. 1, respectively.

Referring to FIGS. 5A and 6, the external memory 510 may store a plurality of first matrices provided from the compression apparatus 50. Here, the plurality of first matrices may be matrices in which the original matrix is quantized and compressed. This is actually because the data in the original matrix is very large, and for example, as illustrated in FIG. 6, the compression apparatus 50 may divide the original matrix into a plurality of matrices, and quantize and compress each of the plurality of matrices to obtain the plurality of first matrices. The compression apparatus 50 may provide the plurality of first matrices to the external memory 510.

Each of the plurality of decoders (D-Units) may receive one of the plurality of first matrices from the external memory 510 and output a decompressed second matrix. That is, the external memory 510 may decompress the plurality of first matrices in parallel by providing the plurality of first matrices to the plurality of decoders, respectively, and parallelism may be improved.

However, the decompression apparatus 100 is not limited thereto, and may also sequentially decompress compressed data such as a method of decompressing data in which a matrix at an upper left of FIG. 6 is compressed and decompressing data in which a matrix adjacent to the right at the upper left of FIG. 6 is compressed.

Each of the plurality of decoders may transmit the decompressed second matrix to an internal memory (on-chip memory) of the processor 530-1. In this case, each of the plurality of decoders may transmit the second matrix via the plurality of de-interleavers 520.

To describe an operation of the plurality of de-interleavers 520, first, an interleaving operation of the compression apparatus 50 will be described. The compression apparatus 50 may interleave each of a plurality of divided matrices as illustrated in FIG. 6. The compression apparatus 50 may quantize and compress each of the plurality of interleaved matrices.

The plurality of de-interleavers 520 may correspond to the interleaving operation of the compression apparatus 50. That is, the plurality of de-interleavers 520 may de-interleave the interleaved matrix to restore the matrix before being interleaved.

In FIG. 5A, the decompression apparatus 100 is illustrated as including the plurality of de-interleavers 520, but is not limited thereto. For example, the compression apparatus 50 may interleave the original matrix itself without interleaving each of the plurality of matrices in which the original matrix is divided. In this case, the decompression apparatus 100 may also include one de-interleaver.

On the other hand, the memory 110 may further store the first pruning index matrix, the second pruning index matrix, and the patch information. In this case, the processor 530-1 may obtain the pruning index matrix from the first pruning index matrix and the second pruning index matrix, and update the second matrix based on the pruning index matrix and the patch information.

On the other hand, referring to FIG. 5B, the decompression apparatus 100 may also be implemented as one chip. That is, in FIG. 5B, the decompression apparatus 100 is illustrated as a processor 530-2, and the processor 530-2 may receive the plurality of first matrices from the external memory 510.

Each of the plurality of decoders in the processor 530-2 may decompress the plurality of first matrices and transmit a plurality of second matrices to a processing element (PE) unit (i.e., PE Array) included in the processor 530-2.

As described above, the compression rate and accuracy may be improved due to the division and interleaving of the original matrix in the compression process, and decompression may be performed in parallel through the plurality of decoders, thereby efficiently performing the decompression.

Figure 7B:
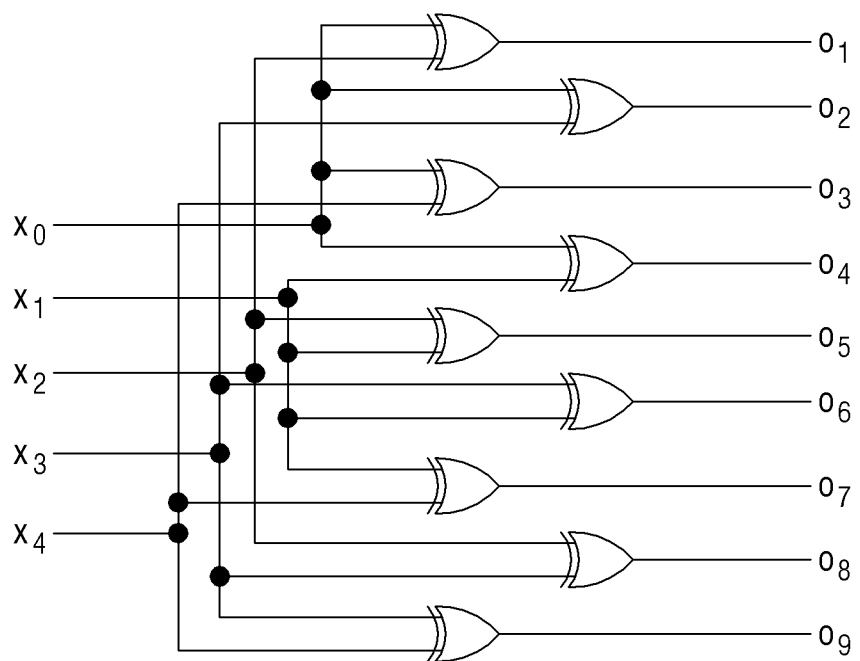
Figure 7C:
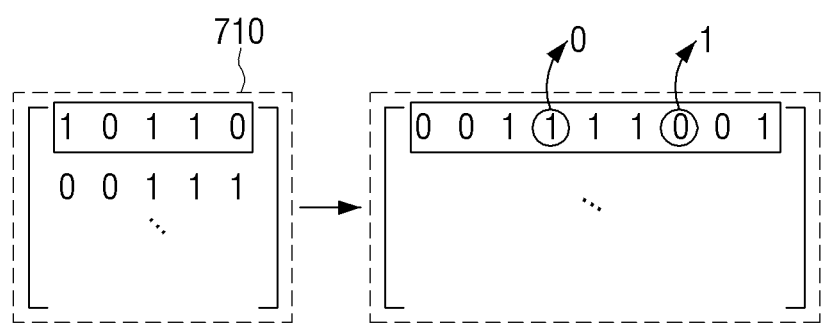

FIGS. 7A to 7C are diagrams describing a method for decompressing a first matrix according to various embodiments of the disclosure.

Referring to FIG. 7A, FIG. 7A illustrates an example of an encoding matrix of 9×5, and illustrates that binary data of units of nine is converted into binary data of units of five in the compression process.

Referring to FIG. 7B, the decoder 120 may be implemented with a plurality of XOR gates to which the respective input/output terminals are connected based on the encoding matrix. However, the decoder 120 is not limited thereto, and may be implemented using a logic circuit other than the plurality of XOR gates, and as long as an operation corresponding to the encoding matrix may be performed, other methods may be used.

The decoder 120 may receive a plurality of binary data included in the first matrix in units of a first number and output a plurality of binary data in units of a second number to be included in the second matrix.

Referring to FIG. 7C, the decoder 120 may output an input of x0 to x4 as O1 to O9. For example, the decoder 120 may convert 10110 of a first matrix 710 into 001111001, as illustrated in FIG. 7C.

The processor 130 may change a value of some data of 001111001 based on the patch information. In FIG. 7C, fourth and seventh data of 001111001 are illustrated as being changed, and 0 may be changed to 1 and 1 may be changed to 0.

Figure 8B:
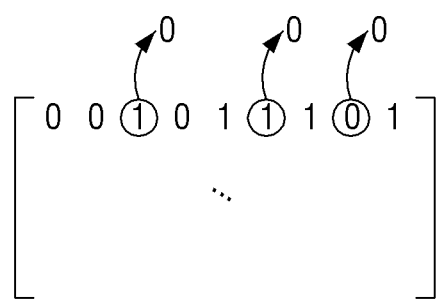

FIGS. 8A and 8B are diagrams describing an update operation of a second matrix according to various embodiments of the disclosure.

Referring to FIGS. 8A and 8B, the processor 130 may receive a second matrix in which each element is 1 bit from each of the plurality of decoders, and receive a pruning index matrix from the memory 110. Alternatively, the processor 130 may receive a first pruning index matrix and a second pruning index matrix from the memory 110 and obtain a pruning index matrix from the first pruning index matrix and the second pruning index matrix.

The processor 130 may identify pruned elements in the second matrix based on the pruning index matrix, as illustrated in FIG. 8A. In addition, the processor 130 may convert the identified elements to 0, as illustrated in FIG. 8B.

Figure 9:
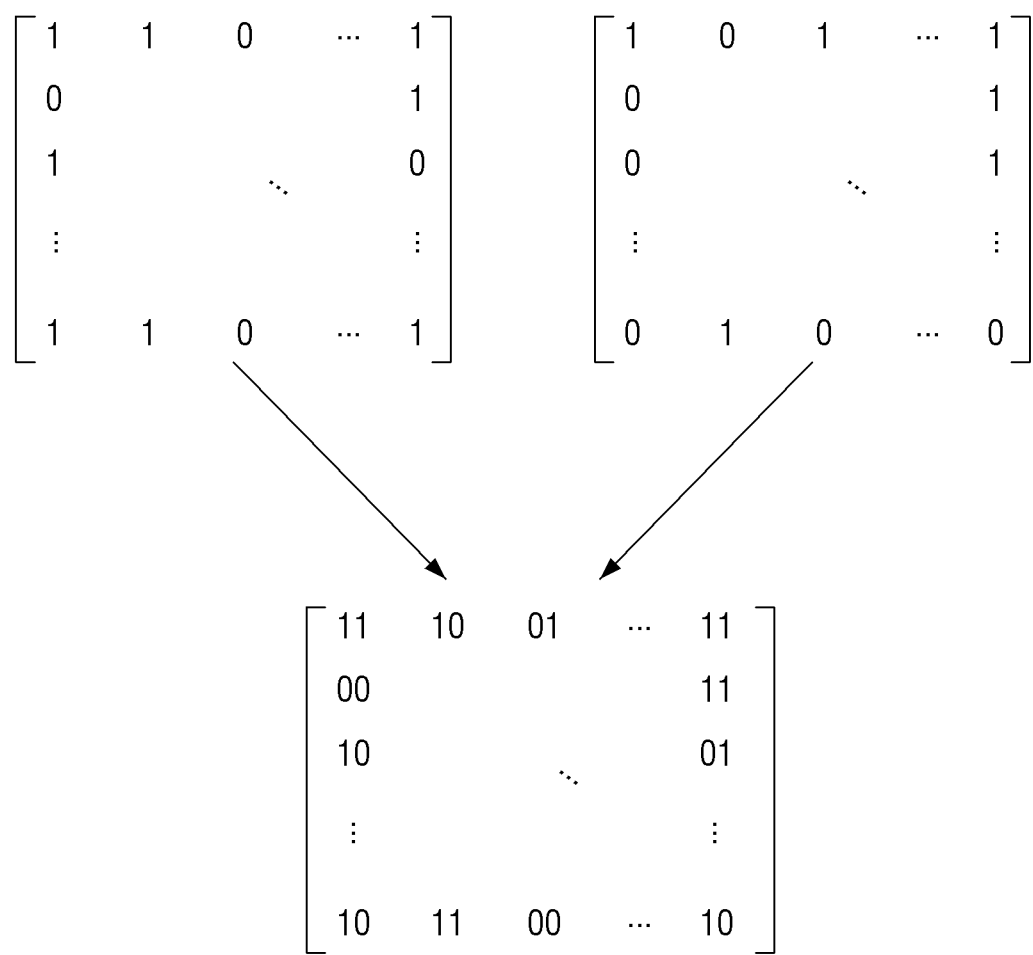
FIG. 9 is a diagram describing a method for merging a plurality of second matrices of a processor according to an embodiment of the disclosure.

FIG. 9 is a diagram describing a method for merging a plurality of second matrices of a processor according to an embodiment of the disclosure.

Referring to FIG. 9, for convenience of explanation, the processor 130 will be described as combining two second matrices.

The decompression apparatus 100 may include a plurality of decoders, and each of the plurality of decoders may transmit a second matrix to the processor 130.

As illustrated in FIG. 9, the processor 130 may combine a second matrix 1 of which each element is 1 bit and a second matrix 2 of which each element is 1 bit to obtain a combined second matrix of which each element is 2 bits.

The processor 130 may convert pruned elements in the combined second matrix of which each element is 2 bits to 0 based on the pruning index matrix.

However, the processor 130 is not limited thereto, and may combine three or more second matrices to obtain a combined second matrix, and convert the pruned elements to 0.

FIG. 10 is a flowchart describing a control method of a decompression apparatus according to an embodiment of the disclosure.

Referring to FIG. 10, first, a plurality of logic circuits related to a compression method of compressed data receives the compressed data decompressed and used in neural network processing of an artificial intelligence model, at operation S1010. In addition, the plurality of logic circuits decompress the compressed data and output the decompressed data, at operation S1020. In addition, data of a neural network processible form is obtained from the data output from the plurality of logic circuits, at operation S1030.

Here, the control method may further include obtaining data of a neural network processible form based on the decompressed data and a representative value matrix corresponding to the compressed data, and performing neural network processing using the data of the neural network processible form, and the decompressed data and the representative value matrix may be matrices obtained by quantizing an original matrix included in an artificial intelligence model.

In addition, the control method may further include updating the decompressed data based on a pruning index matrix corresponding to the compressed data, and the pruning index matrix may be a matrix obtained in the pruning process of the original matrix, and may be used in a process of obtaining the compressed data.

Here, the control method may further include changing binary data values of some of a plurality of elements included in the decompressed data based on patch information corresponding to the compressed data, and the patch information may include error information generated in the process of obtaining compressed data.

Meanwhile, the control method may further include obtaining a pruning index matrix based on a first pruning index matrix corresponding to the compressed data and a second pruning index matrix corresponding to the compressed data, and updating the decompressed data based on the pruning index matrix, the pruning index matrix may be a matrix obtained in the pruning process of the original matrix and may be used in the process of obtaining compressed data, and the first pruning index matrix and the second pruning index matrix may be obtained based on each of the first sub-matrix and the second sub-matrix obtained by factorizing the original matrix.

The decompressed data is a matrix obtained by interleaving the original matrix and then quantizing the interleaved matrix. The control method may further include de-interleaving the neural network processible data according to a manner corresponding to interleaving, and in the performing of the neural network processing, the neural network processing may be performed using the de-interleaved data.

On the other hand, in the performing of the neural network processing at operation S1010, the neural network processing may be performed using a plurality of processing elements arranged in a matrix form.

In addition, the decompressed data may be a matrix obtained by dividing the original matrix into a plurality of matrices having the same number of columns and the same number of rows, and quantizing one of the plurality of divided matrices.

On the other hand, the decompression apparatus includes a plurality of other logic circuits related to the compression method of the other compressed data, and the control method may further include receiving the other compressed data which is decompressed and used in the neural network processing of the artificial intelligence model, decompressing, by the plurality of other logic circuits, the other compressed data and outputting the decompressed other data, obtaining the other data of a neural network processible form output from the plurality of other logic circuits, and obtaining a matrix in which each element includes a plurality of binary data by combining the neural network processible data and the other neural network processible data.

In addition, the decompression apparatus may be implemented as one chip.

FIGS. 11A to 11D are diagrams describing a learning process of an artificial intelligence model according to various embodiments of the disclosure.

Figure 11A:
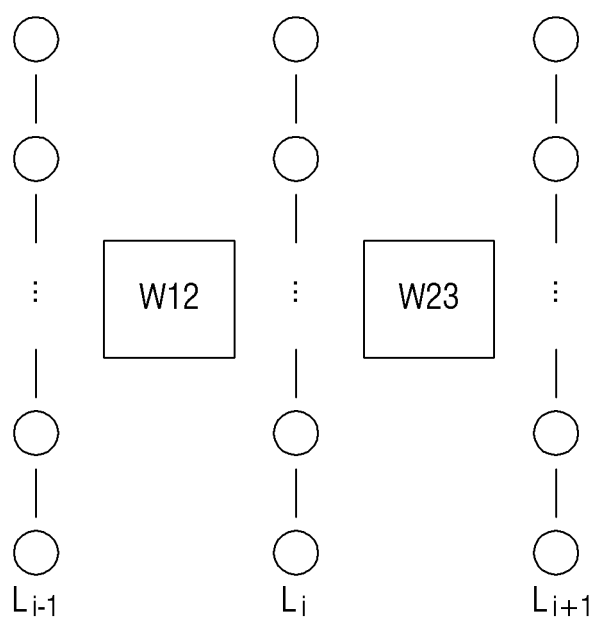

Referring to FIG. 11A, FIG. 11A is a diagram illustrating an example of an artificial intelligence model before learning is completed. The artificial intelligence model includes two original matrices W12 and W23, and the compression apparatus 50 may input values of Li−1 to W12 to obtain intermediate values of Li, and may input the intermediate values of Li into W23 to obtain a final value of Li+1. However, FIG. 11A illustrates the artificial intelligence model very briefly, and the artificial intelligence model may actually include more matrices than FIG. 11A.

Referring to FIG. 11B, FIG. 11B is a diagram illustrating an example of an original matrix included in an artificial intelligence model, which is the same as the description of FIG. 3A. However, the original matrix of FIG. 3A may be in a state in which the learning is completed, and the original matrix of FIG. 11B may be before the learning is completed.

Referring to FIG. 11C, FIG. 11C is a diagram illustrating a result of quantizing the original matrix illustrated in FIG. 11B.

The compression apparatus 50 may quantize each of the plurality of elements included in the original matrix to obtain a representative matrix 1120 and a second matrix 1110 including binary quantized data. In this case, unlike FIG. 3B, the compression apparatus 50 may not perform pruning. However, the compression apparatus 50 is not limited thereto, and may also perform pruning, and a method of performing pruning will be described later.

Figure 11D:
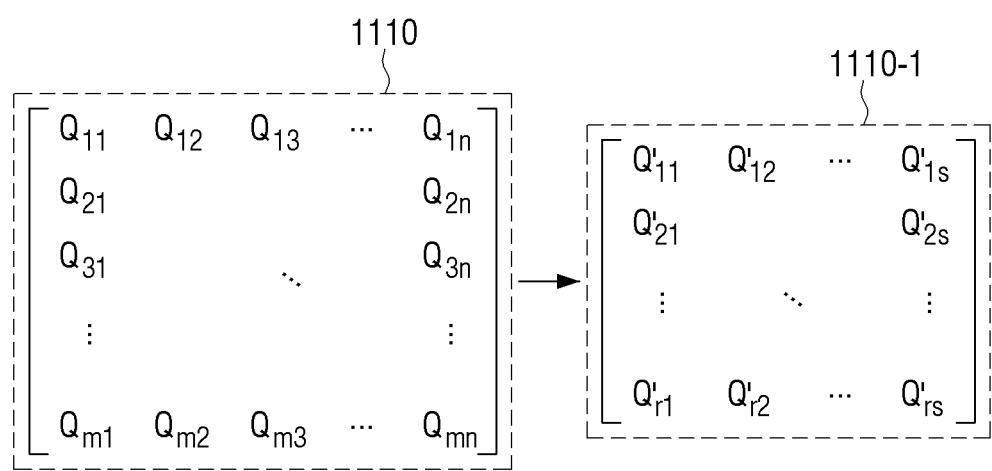

Referring to FIG. 11D, the compression apparatus 50 may compress the second matrix 1110 on the left side of FIG. 11D to obtain a first matrix 1110-1 on the right side of FIG. 11D. The number of elements included in the first matrix 1110-1 is smaller than the number of elements included in the second matrix 1110.

The compression apparatus 50 may obtain the first matrix 1110-1 from the second matrix 1110 based on the encoding matrix as illustrated in FIG. 7A. All of these operations are included in the learning process of the artificial intelligence model. In addition, although only one original matrix has been described in FIGS. 11B to 11D, in the learning process of the artificial intelligence model, the entire plurality of original matrices included in the artificial intelligence model may be compressed as illustrated in FIGS. 11B to 11D.

More specifically, for example, W12 of FIG. 11A may be quantized and may be compressed based on the first encoding matrix and stored as Q12', as illustrated in the right side of FIG. 11D. In addition, W23 of FIG. 11A may be quantized and may be compressed based on the second encoding matrix and stored as Q23' as illustrated in the right side of FIG. 11D. The compression apparatus 50 may decompress and dequantize Q12' through the first encoding matrix to obtain W12, and may decompress and dequantize Q23' through the second encoding matrix to obtain W23. In addition, the compression apparatus 50 may perform a feed forward operation by using W12 and W23. In this case, the first encoding matrix and the second encoding matrix may be implemented as XOR gates as illustrated in FIG. 7B. That is, the compression apparatus 50 may digitize Q12' to 0 or 1 when decompressing Q12' through the first encoding matrix. In addition, the compression apparatus 50 may digitize Q23' to 0 or 1 when decompressing Q23' through the second encoding matrix.

Thereafter, the compression apparatus 50 may perform a backward operation to update the elements included in the artificial intelligence model. However, because the operation using the XOR gate is an operation by a digital circuit, differentiation is impossible, but the differentiation is required in the updating process. Accordingly, the compression apparatus 50 may learn the artificial intelligence model by converting the operation using the XOR gate into a form that may be differentiated as illustrated in Mathematical expression 1 below. 0 of the input value may be converted to −1 and input to Mathematical expression 1 below.

$$XOR(a,b) = (-1) \times \tanh(a) \times \tanh(b) \quad \text{Mathematical expression 1}$$

Mathematical expression 1 illustrates a case in which the input values are a and b, but the input values may not actually be two. The input value may vary depending on a size of the encoding matrix, the number of 1s included in one row, and the like. Accordingly, the compression apparatus 50 may learn the artificial intelligence model using more general Mathematical expression, such as Mathematical expression 2 below.

$$\text{analog\_xor\_function}(X) = (-1.0)^{n-1} * \prod_{i=0}^{n-1} \tanh(x_i * m_i) \quad \text{Mathematical expression 2}$$

Figure 13:
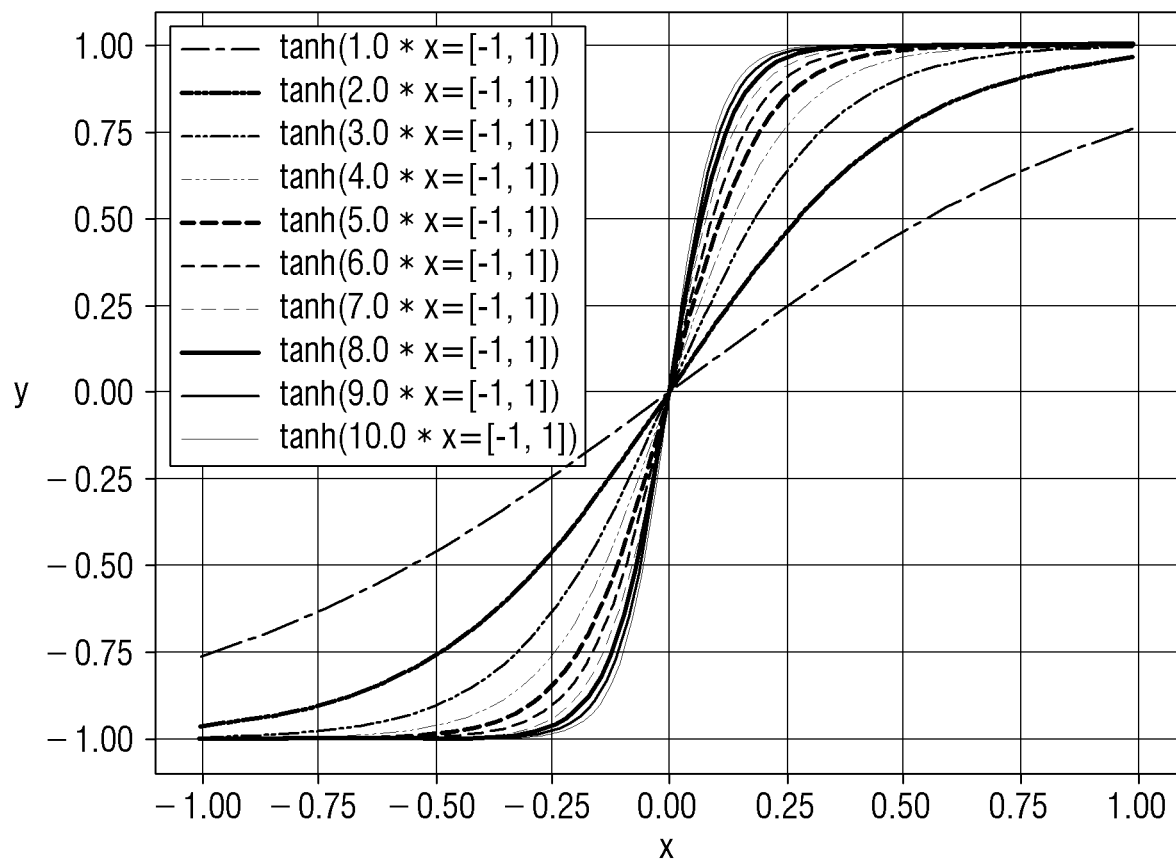
FIG. 13 is a diagram describing an influence of a value of m according to an embodiment of the disclosure.

Here, X is an input of the XOR gate and m is a variable for adjusting a learning speed, each may be represented as follows. FIG. 13 is a diagram illustrating an output according to a value of m, and as a gradient is changed, the learning speed may vary. The value of m may be set by a user.

$$X = [x_0 \ x_1 \ \ldots \ x_{n-1}]$$

$$M = [m_0 \ m_1 \ \ldots \ m_{m-1}], m_i \in \{0,1\}$$

As described above, the compression apparatus 50 may analogize the operation of the XOR gate to be used for learning the artificial intelligence model. That is, the input value of the XOR gate is stored as a real number, but the compression apparatus 50 converts negative numbers to zero and positive numbers to one among the input values of the XOR gates in an inference process. That is, the compression apparatus 50 digitizes the input values of the XOR gate to process an error caused by using the digital circuit such as the XOR gate.

In addition, the compression apparatus 50 may maintain a full-precision value in the backward process, and update internal variables in Mathematical expression of a differentiable form. That is, even if the XOR gate is used in the decompression process, the compression apparatus 50 may include the operation according to the XOR gate in the learning process of the artificial intelligence model to perform the learning as the compression apparatus 50 uses Mathematical expression of the differentiable form.

Meanwhile, a loss value used in the learning process of the artificial intelligence model is expressed by Mathematical expression 3 below. The compression apparatus 50 may learn the artificial intelligence model through processing as illustrated in Mathematical expression 3 below.

Mathematical expression 3

$$\frac{\partial \text{Loss}}{\partial x_i} = \frac{\partial \text{Loss}}{\partial w_{decode}} * \frac{\partial w_{decode}}{\partial x_i}$$

$$\frac{\partial w_{decode}}{\partial x_i} =$$

$$\frac{\partial(a*axor(X))}{\partial x_i} = a*(-1.0)^{(n-1)} m_i \tanh^{-1}(x_i) \prod_{j=1, j \neq i}^{n-1} \tanh^{-1}(x_j m_j)$$

Figure 14A:
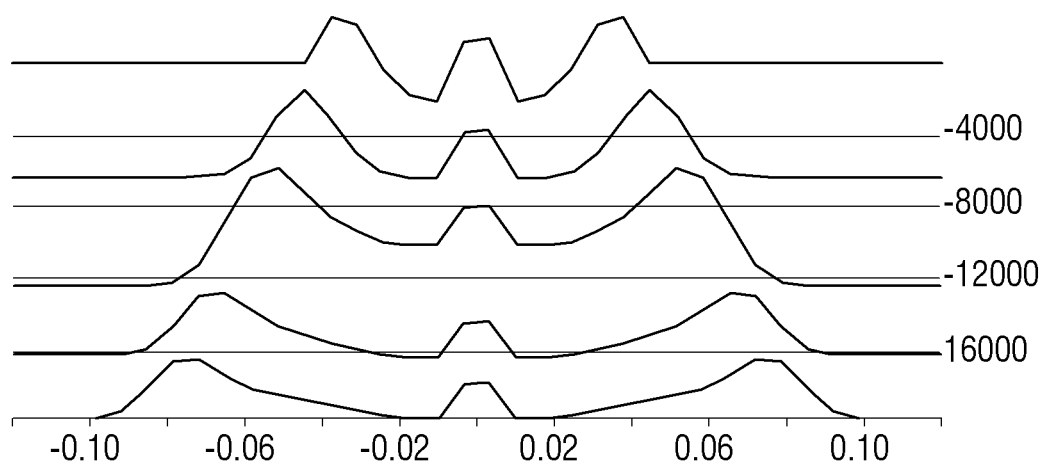
FIGS. 14A and 14B are diagrams describing a learning speed improvement according to various embodiments of the disclosure.
Figure 14B:
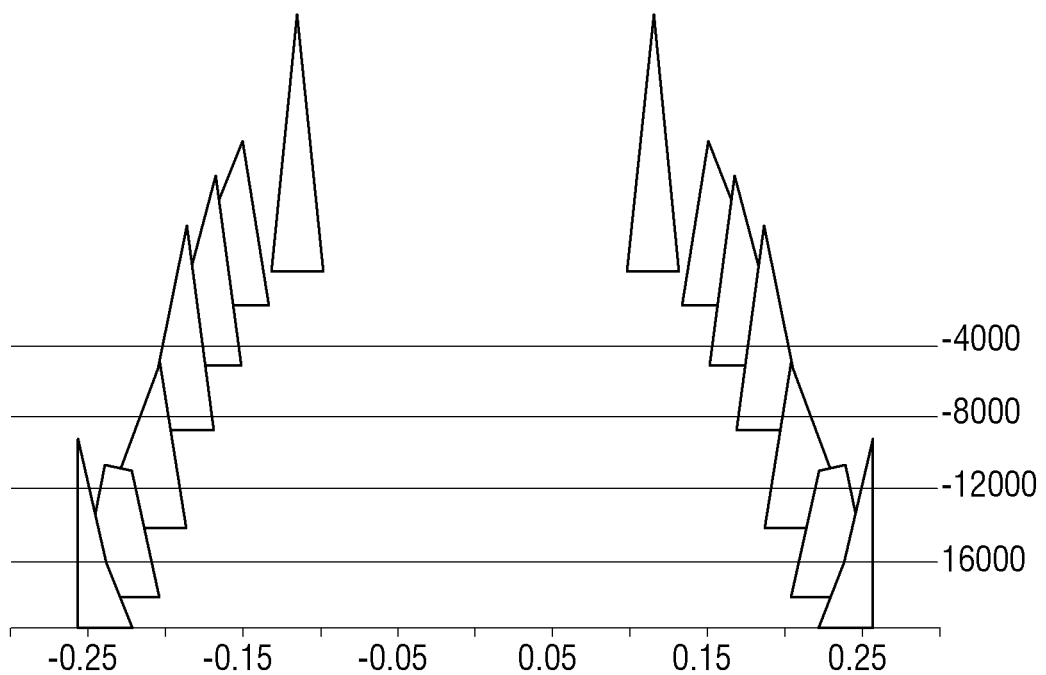

Here, because $\tanh^{-1}(x_j m_j)$ is a value between −1 and 1, $$\prod_{j=1, j \neq i}^{n-1} \tanh^{-1}(x_j m_j)$$

is getting closer to zero. That is, as the number of inputs and outputs of the XOR gate increases, the learning becomes more difficult. Accordingly, the compression apparatus 50 may also learn the artificial intelligence model by using the form of tanh for the differentiation of itself (e.g., i) in Mathematical expression 3, and converting tanh to sign for the differentiation of the remainder (e.g., j≠i). In this case, a backward path may be simplified regardless of the number of inputs and outputs of the XOR gate, thereby improving the learning speed. FIG. 14A illustrates a case in which Mathematical expression 3 is used, and FIG. 14B illustrates a case in which some tanh of Mathematical expression 3 is converted into sign. As learning progresses, as illustrated in FIG. 14B, the values of 0 and 1 are clearly distinguished, and the learning speed may be improved.

When the learning is completed as described above, the compression apparatus 50 may obtain a plurality of first matrices corresponding to each of the plurality of original matrices included in the artificial intelligence model.

The compression apparatus 50 may perform the learning while including the operation of the XOR gate in the artificial intelligence model as described above, thereby securing a high level of compression rate while maintaining an accuracy of the artificial intelligence model. In addition, because the pruning process is omitted and there is no need to use the patch information, a processing speed may be improved.

In the case of FIGS. 1, 2, 3A to 3D, 4, 5A and 5B, 6, 7A to 7C, 8A and 8B, 9, and 10, after checking the pruning result, the size of the encoding matrix may be determined. On the other hand, when the learning is performed while including the operation of the XOR gate in the artificial intelligence model, the size of the encoding matrix may be arbitrarily specified to set a fractional quantization bit value without pruning. For example, 0.7 bit quantization may also be possible instead of the number of integers.

The compression apparatus 50 may use a plurality of encoding matrices corresponding to each of the plurality of original matrices included in the artificial intelligence model. For example, the compression apparatus 50 may use an encoding matrix for performing compression of a relatively low compression rate on the first original matrix and the last original matrix of the artificial intelligence model, and may use an encoding matrix for performing compression of a relatively high compression rate on the remaining original matrix of the artificial intelligence model.

Even when the compression is performed in the method as described above, the decompression apparatus 100 may decompress by operating as illustrated in FIG. 1, and a description thereof will be omitted because it is a redundant description.

Figure 12:
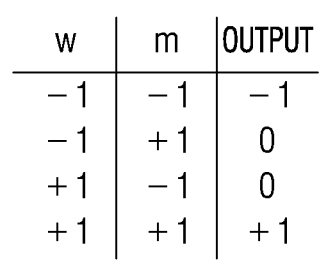

FIG. 12 is a diagram describing a method for performing pruning in a learning process according to an embodiment of the disclosure.

In FIGS. 11A to 11D, the learning method in which the pruning is omitted and the quantization using the XOR gate is included in the artificial intelligence model has been described, but the compression apparatus 50 may learn the artificial intelligence model by including quantization using the pruning and the XOR gate in the artificial intelligence model.

FIG. 13 is a diagram for describing an influence of a value of m according to an embodiment of the disclosure.

FIGS. 14A and 14B are diagrams for describing a learning speed improvement according to various embodiments of the disclosure.

Referring to FIGS. 12, 13, 14A, and 14B, the compression apparatus 50 may reflect the pruning using two XOR gates per weight. For example, the compression apparatus 50 may obtain a final output from two outputs (w, m) of the XOR gate. Here, w is the output of the XOR gate described with reference to FIGS. 11A to 11D, and m may be a value for reflecting the pruning. For example, the compression apparatus 50 may output −1 if (0, 0), output 0 if (0, 1) or (1, 0), and +1 if (1, 1).

The compression apparatus 50 may output three values from w and m through Equation such as (w+m)/2, and to this end, the compression apparatus 50 converts the input value into −1 when the input value is 0, and converts the input value into +1 when the input value is 1, and inputs the converted value to an Equation.

The compression apparatus 50 performs the learning of w by the method described with reference to FIGS. 11A to 11D, and redundant description thereof will be omitted.

When the value of w is a threshold value or less, the compression apparatus 50 may set m to a value opposite to the value of w and finally convert w to 0 and output the result. Alternatively, when the value of w exceeds the threshold value, the compression apparatus 50 may set m to a value having the same sign as the value of w and finally convert w to +1 or −1 and output the result. In this way, an effect of pruning by converting w of the threshold value or less to 0 may be obtained.

When the learning is completed as described above, the compression apparatus 50 may obtain a plurality of first matrices corresponding to each of the plurality of original matrices included in the artificial intelligence model. However, unlike FIGS. 1, 2, 3A to 3D, 4, 5A and 5B, 6, 7A to 7C, 8A and 8B, 9, and 10, a separate pruning index matrix is not generated.

As described above, the compression apparatus 50 may include the quantization using the pruning and the XOR gate in the artificial intelligence model to perform the learning of the artificial intelligence model, thereby facilitating the learning and improving the accuracy.

Even when the compression is performed in the method as described above, the decompression apparatus 100 may decompress by operating as illustrated in FIG. 1, and a description thereof will be omitted because it is a redundant description.

The operations of the compression apparatus 50 or the operations of the decompression apparatus 100 of FIGS. 11A to 11D, 12, 13, 14A, and 14B may be performed by an electronic apparatus such as a mobile device or a desktop PC. For example, a memory of a first electronic apparatus may store the artificial intelligence model before the learning is completed and sample data necessary for the learning process, and a processor of the first electronic apparatus may learn the data stored in the memory in the same manner as in FIGS. 11A to 11D, 12, 13, 14A, and 14B and simultaneously compress the data.

In addition, a memory of a second electronic apparatus may store an artificial intelligence model that the learning and the compression are completed, and a processor of the second electronic device may process the data stored in the memory like the quantization acquisition matrix unit of FIG. 2 to decompress the data.

As described above, according to diverse embodiments of the disclosure, the decompression apparatus may perform the neural network processing by decompressing the matrix using the decoder implemented with the plurality of logic circuits and obtaining the restored matrix from the decompressed matrix.

Meanwhile, according to an embodiment of the disclosure, the diverse embodiments described hereinabove may be implemented by software including instructions that are stored in machine (e.g., a computer)-readable storage media. The machine is an apparatus that invokes the stored instructions from the storage media and is operable according to the invoked instructions, and may include the electronic apparatus (e.g., an electronic apparatus A) according to the disclosed embodiments. When the instructions are executed by the processor, the processor may perform functions corresponding to the instructions, either directly or using other components under the control of the processor. The instructions may include codes generated or executed by a compiler or an interpreter. The machine-readable storage media may be provided in the form of non-transitory storage media. Here, the term 'non-transitory' means that the storage medium does not include a signal and is tangible, but does not distinguish whether data is stored semi-permanently or temporarily in the storage medium.

In addition, according to an embodiment of the disclosure, the method according to the diverse embodiments described above may be included and provided in a computer program product. The computer program product may be traded as a product between a seller and a purchaser. The computer program product may be distributed in the form of a machine readable storage media (e.g., a compact disc read only memory (CD-ROM)), or online through an application store (e.g., PlayStore™) In the case of the online distribution, at least a portion of the computer program product may be at least temporarily stored in a storage medium such as a memory of a server of a manufacturer, a server of an application store, or a relay server, or be temporarily generated.

In addition, according to an embodiment of the disclosure, the diverse embodiments described above may be implemented in a computer or similar device readable recording medium using software, hardware, or a combination thereof. In some cases, the embodiments described in the disclosure may be implemented by the processor itself. According to software implementation, the embodiments such as procedures and functions described in the disclosure may be implemented as separate software modules. Each of the software modules may perform one or more functions and operations described in the disclosure.

Meanwhile, computer instructions for performing processing operations of the device according to the diverse embodiments described above may be stored in a non-transitory computer-readable medium. The computer instructions stored in the non-transitory computer-readable medium allow a specific device to perform the processing operations of the device according to the diverse embodiments described above when being executed by a processor of the specific device. The non-transitory computer readable medium is not a medium that stores data for a short time such as a register, a cache, a memory, or the like, but means a machine readable medium that semi-permanently stores data. A specific example of the non-transitory computer-readable medium may include a compact disc (CD), a digital versatile disc (DVD), a hard disk, a Blu-ray disc, a universal serial bus (USB), a memory card, a read only memory (ROM), or the like.

In addition, each of the components (e.g., modules or programs) according to the diverse embodiments described above may include a single entity or a plurality of entities, and some sub-components of the sub-components described above may be omitted, or other sub-components may be further included in the diverse embodiments. Alternatively or additionally, some components (e.g., modules or programs) may be integrated into one entity to perform the same or similar functions performed by the respective components prior to the integration. The operations performed by the module, the program, or other component according to the diverse embodiments may be performed in a sequential, parallel, iterative, or heuristic manner, or at least some operations may be executed in a different order or omitted, or other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A decompression apparatus comprising:
 a memory configured to store:
  compressed data, the compressed data configured to be decompressed and used in neural network processing of an artificial intelligence model, and
  a patch information corresponding to the compressed data;
 a decoder comprising a plurality of logic circuits related to a compression method of the compressed data, the decoder being configured to:
  decompress the compressed data through the plurality of logic circuits based on an input of the compressed data, and
  output the decompressed data; and
 a processor configured to change some binary data values of a plurality of elements included in the decompressed data output from the decoder based on the patch information and obtain data of a neural network processible form from the decompressed data,
 wherein the patch information comprises error information generated in a process of obtaining the compressed data.

2. The decompression apparatus of claim 1,
wherein the memory is further configured to store a representative value matrix corresponding to the compressed data,
wherein the processor is further configured to:
obtain the data of the neural network processible form based on the decompressed data and the representative value matrix, and
perform the neural network processing using the data of the neural network processible form, and
wherein the decompressed data and the representative value matrix comprise matrices obtained by quantizing an original matrix included in the artificial intelligence model.

3. The decompression apparatus of claim 2,
wherein the memory is further configured to store a pruning index matrix corresponding to the compressed data,
wherein the processor is further configured to update the decompressed data based on the pruning index matrix,
wherein the pruning index matrix comprises a matrix obtained in a pruning process of the original matrix, and
wherein the pruning index matrix is used in a process of obtaining the compressed data.

4. The decompression apparatus of claim 2,
wherein the memory is further configured to:
store a first pruning index matrix corresponding to the compressed data, and
store a second pruning index matrix corresponding to the compressed data,
wherein the processor is further configured to:
obtain a pruning index matrix based on the first pruning index matrix and the second pruning index matrix, and
update the decompressed data based on the pruning index matrix,
wherein the pruning index matrix comprises a matrix obtained in a pruning process of the original matrix,
wherein the pruning index matrix is used in a process of obtaining the compressed data, and
wherein the first pruning index matrix and the second pruning index matrix are obtained based on each of a first sub-matrix and a second sub-matrix obtained by factorizing the original matrix.

5. The decompression apparatus of claim 2,
wherein the decompressed data comprises a matrix obtained by interleaving the original matrix and then quantizing the interleaved matrix, and
wherein the processor is further configured to:
de-interleave the data of the neural network processible form according to a manner corresponding to the interleaving, and
perform the neural network processing using the de-interleaved data.

6. The decompression apparatus of claim 2,
wherein the processor comprises a plurality of processing elements arranged in a matrix form, and
wherein the processor is further configured to perform the neural network processing using the plurality of processing elements.

7. The decompression apparatus of claim 2, wherein the decompressed data comprises a matrix obtained by dividing the original matrix into a plurality of matrices each having a same number of columns and rows and quantizing one of the plurality of matrices.

8. The decompression apparatus of claim 2, wherein the original matrix comprises a matrix obtained after a learning process of the artificial intelligence model is completed.

9. The decompression apparatus of claim 2, wherein the original matrix is in a non-compressed state.

10. The decompression apparatus of claim 1,
wherein the memory is further configured to store other compressed data configured to be decompressed and used in the neural network processing of the artificial intelligence model,
wherein the decompression apparatus further comprises another decoder configured to:
include a plurality of other logic circuits related to a compression method of the other compressed data,
decompress the other compressed data through the plurality of other logic circuits based on an input of the other compressed data, and
output the decompressed other data, and
wherein the processor is further configured to:
obtain other data of a neural network processible form from the decompressed other data output from the other decoder, and
obtain a matrix in which each element includes a plurality of binary data by coupling the neural network processible data and the other data of the neural network processible form.

11. The decompression apparatus of claim 1, wherein the decompression apparatus is implemented as one chip.

12. A control method of a decompression apparatus comprising a plurality of logic circuits related to a compression method of compressed data, the control method comprising:
receiving, by the plurality of logic circuits, the compressed data, the compressed data configured to be decompressed and used in neural network processing of an artificial intelligence model;
decompressing, by the plurality of logic circuits, the compressed data;
outputting the decompressed data;
changing some binary data values of a plurality of elements included in the decompressed data output from the plurality of logic circuits based on a patch information corresponding to the compressed data; and
obtaining data of a neural network processible form from the decompressed data,
wherein the patch information comprises error information generated in a process of obtaining the compressed data.

13. The control method of claim 12, further comprising:
obtaining the data of the neural network processible form based on the decompressed data and a representative value matrix corresponding to the compressed data; and
performing the neural network processing using the data of the neural network processible form,
wherein the decompressed data and the representative value matrix comprise matrices obtained by quantizing an original matrix included in the artificial intelligence model.

14. The control method of claim 13, further comprising:
updating the decompressed data based on a pruning index matrix corresponding to the compressed data,
wherein the pruning index matrix comprises a matrix obtained in a pruning process of the original matrix, and
wherein the pruning index matrix is used in a process of obtaining the compressed data.

15. The control method of claim 13, further comprising:
obtaining a pruning index matrix based on a first pruning index matrix corresponding to the compressed data and a second pruning index matrix corresponding to the compressed data; and
updating the decompressed data based on the pruning index matrix,
wherein the pruning index matrix comprises a matrix obtained in a pruning process of the original matrix,
wherein the pruning index matrix is used in the process of obtaining the compressed data, and
wherein the first pruning index matrix and the second pruning index matrix are obtained based on each of a first sub-matrix and a second sub-matrix obtained by factorizing the original matrix.

16. The control method of claim 13,
wherein the decompressed data comprises a matrix obtained by interleaving the original matrix and then quantizing the interleaved matrix,
wherein the control method further comprises de-interleaving the data of the neural network processible form according to a manner corresponding to the interleaving, and
wherein the neural network processing is performed using the de-interleaved data.

17. The control method of claim 13, wherein the neural network processing is performed using a plurality of processing elements arranged in a matrix form.

18. The control method of claim 13, wherein the decompressed data comprises a matrix obtained by dividing the original matrix into a plurality of matrices each having a same number of columns and rows and quantizing one of the plurality of matrices.

19. The control method of claim 13, wherein the original matrix comprises a matrix obtained after a learning process of the artificial intelligence model is completed.

20. The control method of claim 12,
wherein the decompression apparatus further comprises a plurality of other logic circuits related to a compression method of other compressed data, and
wherein the control method further comprises:
receiving the other compressed data configured to be decompressed and used in the neural network processing of the artificial intelligence model,
decompressing, by the plurality of other logic circuits, the other compressed data,
outputting the decompressed other data,
obtaining other data of a neural network processible form output from the plurality of logic circuits, and
obtaining a matrix in which each element includes a plurality of binary data by coupling the neural network processible data and the other data of the neural network processible form.

* * * * *